(12) United States Patent
Kim et al.

(10) Patent No.: US 9,281,406 B2
(45) Date of Patent: Mar. 8, 2016

(54) THIN FILM TRANSISTOR SUBSTRATE, DISPLAY DEVICE INCLUDING THE SAME, AND FABRICATING METHOD OF THE THIN FILM TRANSISTOR SUBSTRATE

(71) Applicant: Samsung Display Co., Ltd., Yongin, Gyeonggi-Do (KR)

(72) Inventors: Ki-Won Kim, Suwon-si (KR); Kap Soo Yoon, Cheonan-si (KR); Jiyun Hong, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/458,415

(22) Filed: Aug. 13, 2014

(65) Prior Publication Data
US 2015/0200304 A1   Jul. 16, 2015

(30) Foreign Application Priority Data

Jan. 13, 2014   (KR) ..................... 10-2014-0004081

(51) Int. Cl.
*H01L 23/544* (2006.01)
*H01L 29/786* (2006.01)
*H01L 29/66* (2006.01)
*H01L 27/12* (2006.01)

(52) U.S. Cl.
CPC ........ *H01L 29/7869* (2013.01); *H01L 27/1225* (2013.01); *H01L 29/66969* (2013.01)

(58) Field of Classification Search
CPC ............... H01L 2223/54426; H01L 23/544; H01L 27/1214; H01L 27/1288; H01L 51/0011; G03F 9/00

See application file for complete search history.

(56) References Cited

U.S. PATENT DOCUMENTS

| | | | | |
|---|---|---|---|---|
| 5,691,794 A * | 11/1997 | Hoshi et al. | ................. | 349/158 |
| 6,020,867 A * | 2/2000 | Shimada et al. | ............... | 345/87 |
| 6,204,895 B1 * | 3/2001 | Nakamura et al. | .............. | 349/5 |
| 8,283,668 B2 * | 10/2012 | Park | ............................. | 257/59 |
| 8,507,330 B2 * | 8/2013 | Wang et al. | ................. | 438/151 |
| 2003/0068836 A1 * | 4/2003 | Hongo et al. | ................. | 438/30 |
| 2004/0041158 A1 * | 3/2004 | Hongo et al. | ................. | 257/79 |
| 2007/0269936 A1 * | 11/2007 | Tanaka et al. | ................ | 438/133 |
| 2010/0321279 A1 | 12/2010 | Jung et al. | | |
| 2012/0040495 A1 | 2/2012 | Noda et al. | | |
| 2012/0241737 A1 | 9/2012 | Imoto et al. | | |
| 2012/0244659 A1 | 9/2012 | Imoto et al. | | |
| 2012/0252173 A1 | 10/2012 | Imoto et al. | | |
| 2013/0009147 A1 | 1/2013 | Koyama et al. | | |
| 2015/0003040 A1 * | 1/2015 | Bessho et al. | ................. | 362/84 |

FOREIGN PATENT DOCUMENTS

KR   1020100084029 A   7/2010
KR   10-1033955 B1   5/2011

* cited by examiner

*Primary Examiner* — Evan Pert
*Assistant Examiner* — Gustavo Ramallo
(74) *Attorney, Agent, or Firm* — Cantor Colburn LLP

(57) ABSTRACT

A method of fabricating a thin-film transistor substrate includes disposing an oxide semiconductor layer on an insulating substrate, performing a thermal treatment process to the oxide semiconductor layer, providing an alignment mark, a source electrode, a drain electrode, and an oxide semiconductor pattern, after the thermal treatment process, providing a gate electrode, after the thermal treatment process, and providing a pixel electrode connected to the drain electrode.

15 Claims, 24 Drawing Sheets

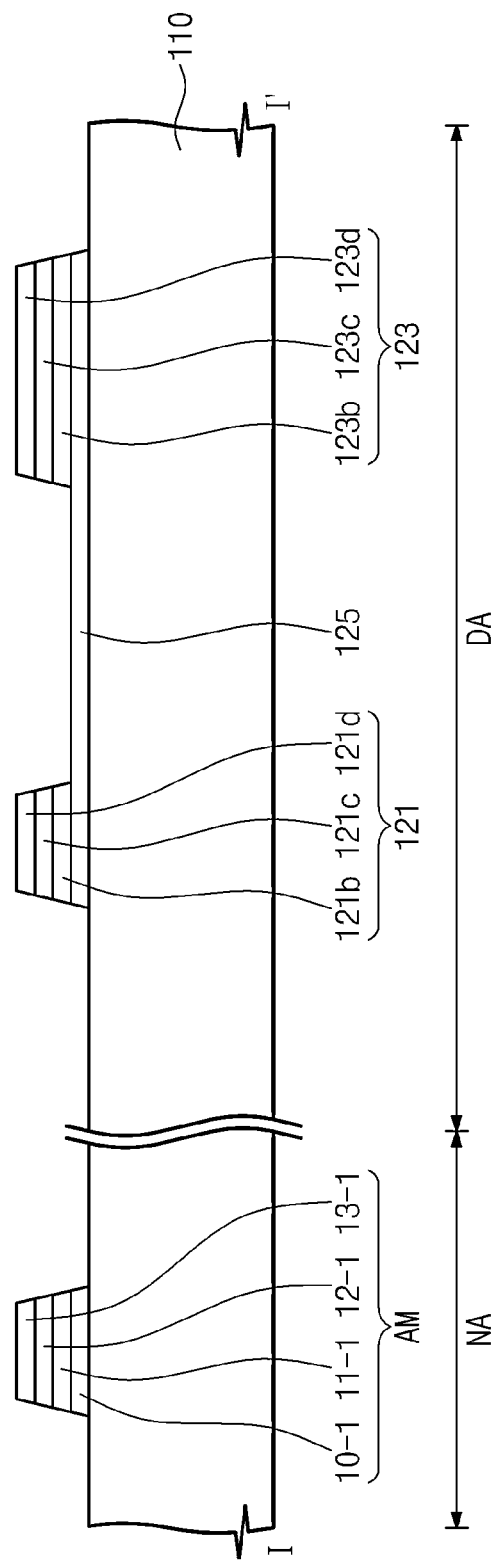

|  | Mean Deviation | | Minimum Deviation | | Maximum Deviation | |
| --- | --- | --- | --- | --- | --- | --- |
|  | Dx | Dy | Dx | Dy | Dx | Dy |
| Before Thermal Treatment Process | -0.26 | 0.46 | -3.54 | -2.27 | 3.24 | 3.50 |
| After Thermal Treatment Process | -0.59 | 0.21 | -8.50 | -6.17 | 7.97 | 6.63 |

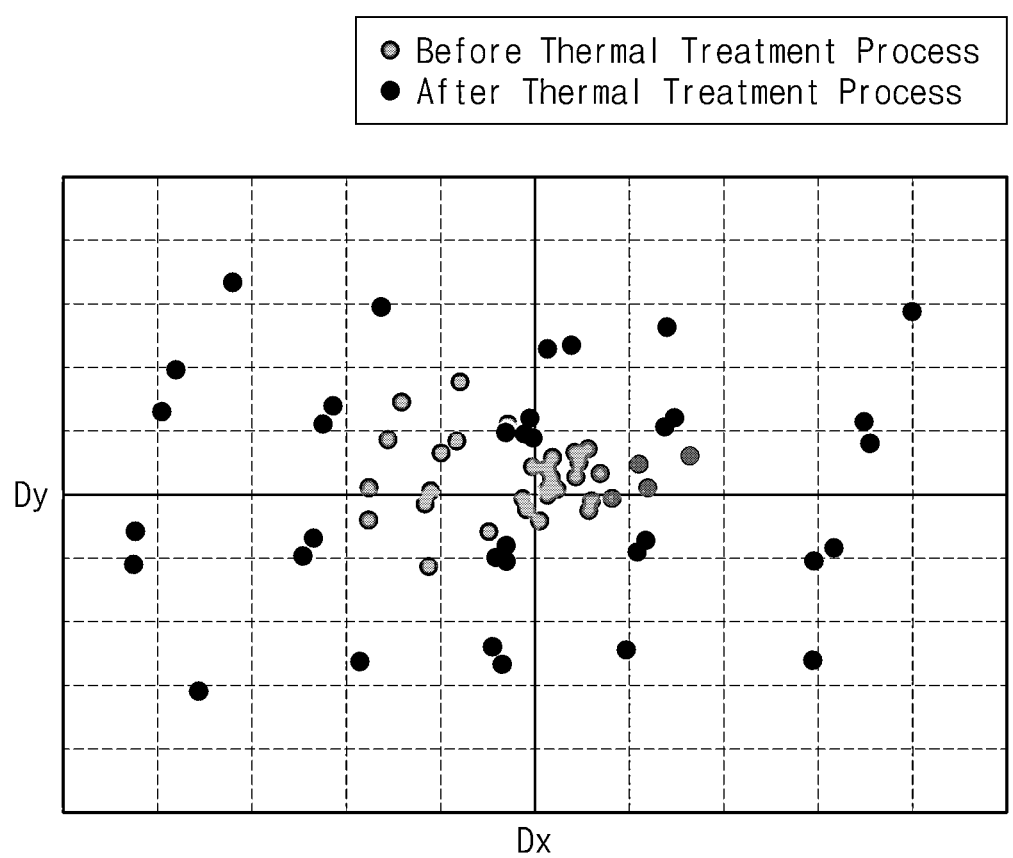

THIN FILM TRANSISTOR SUBSTRATE, DISPLAY DEVICE INCLUDING THE SAME, AND FABRICATING METHOD OF THE THIN FILM TRANSISTOR SUBSTRATE

This application claims priority to Korean Patent Application No. 10-2014-0004081, filed on Jan. 13, 2014, and all the benefits accruing therefrom under 35 U.S.C. §119, the entire contents of which are hereby incorporated by reference.

BACKGROUND

1. Field

Exemplary embodiments of the invention relate to a thin-film transistor ("TFT") substrate and a display device, and in particular, to a TFT substrate using an oxide semiconductor, a display device including the same, and a method of fabricating the TFT substrate.

2. Description of the Related Art

In general, a display device has a pair of electrodes, which are used to generate electric field, and an electro-optical active layer interposed therebetween. One of the pair of the electrodes is applied to an electric signal via a switching device.

In the display device, a thin-film transistor ("TFT") may be used as the switching device. The TFT has an active layer, which is generally including amorphous silicon, but recently, as demands for large displaying area and high resolution in the display device increase, there is an increasing need for a TFT capable of providing a high performance. However, it is expected that the amorphous-silicon-based TFT technology could not realize mobility higher than 0.5 centimeters squared per volt-second ($cm^2/Vs$).

Accordingly, several next-generation devices are being actively studied. An oxide semiconductor is receiving great attention, because it has high mobility, which ranges from several tens $cm^2/Vs$ to several hundreds $cm^2/Vs$, is suitable for a large-area display panel, is fabricated at a low process temperature, and has low photo insensitiveness.

SUMMARY

In a case where an oxide semiconductor is used as an active layer, a high-temperature thermal treatment should be performed in a subsequent process. However, the thermal treatment may result in shrinkage of a substrate and misalignment between upper and lower patterns and furthermore, lead to problems, such as light leakage or process failures.

Exemplary embodiments of the invention provide a fabrication method capable of effectively preventing an alignment mark from being shrunken and thereby effectively preventing misalignment from occurring in subsequent processes.

Other exemplary embodiments of the invention provide a thin-film transistor ("TFT") substrate, which is configured to effectively prevent misalignment and failures caused thereby, and a display device including the TFT substrate.

According to exemplary embodiments of the invention, a method of fabricating a TFT substrate may include disposing an oxide semiconductor layer on an insulating substrate, performing a thermal treatment process to the oxide semiconductor layer, providing an alignment mark, a source electrode, a drain electrode, and an oxide semiconductor pattern, after the thermal treatment process, providing a gate electrode, after the thermal treatment process, and providing a pixel electrode connected to the drain electrode.

In exemplary embodiments, providing the alignment mark, the source electrode, the drain electrode, and the oxide semiconductor pattern may include providing at least two deposition layers on the oxide semiconductor layer, and patterning the at least two deposition layers using a halftone mask.

In exemplary embodiments, the patterning the at least two deposition layers may include providing a photosensitive film on the at least two deposition layers, exposing and developing the photosensitive film and providing first and second photosensitive film portions, etching the at least two deposition layers using the first and second photosensitive film portions as an etch mask and providing the alignment mark and a data pattern, removing the first photosensitive film and the second photosensitive film portions and providing a third photosensitive film portion, and partially removing the data pattern using the third photosensitive film portion as an etch mask. The exposing the photosensitive film may be performed using the halftone mask, and thus the first and second photosensitive film portions may have different thicknesses from each other.

In exemplary embodiments, the providing the at least two deposition layers may include disposing a first material layer on the oxide semiconductor layer, disposing a second material layer on the first material layer, and disposing a third material layer on the second material layer.

In exemplary embodiments, the oxide semiconductor layer includes at least one of zinc (Zn), indium (In), tin (Sn), and gallium (Ga).

In exemplary embodiments, each of the first and third material layers may include at least one of vanadium (V), zirconium (Zr), tantalum (Ta), manganese (Mn), magnesium (Mg), chromium (Cr), molybdenum (Mo), cobalt (Co), niobium (Nb), nickel (Ni), copper alloys, indium-zinc oxide, gallium-zinc oxide, and aluminum-zinc oxide.

According to exemplary embodiments of the invention, a TFT substrate may include an insulating substrate, an oxide semiconductor pattern, an alignment mark, a source electrode, a drain electrode, a gate electrode, and a pixel electrode.

In exemplary embodiments, the insulating substrate may include a display region and a non-display region adjacent to the display region. The oxide semiconductor pattern may be disposed on the insulating substrate and overlapped with the display region. The alignment mark may be overlapped with the non-display region. The source electrode may be disposed on the oxide semiconductor pattern. A drain electrode may be disposed on the oxide semiconductor pattern and spaced apart from the source electrode. A gate electrode may be disposed on the oxide semiconductor pattern and electrically separated from the source and drain electrodes. The pixel electrode may be connected to the drain electrode.

In exemplary embodiments, the alignment mark may include a first layer and a mark layer. The first layer may be disposed at the same level as the oxide semiconductor pattern. The mark layer may be provided disposed at the same level as the source electrode and the drain electrode.

BRIEF DESCRIPTION OF THE DRAWINGS

Exemplary embodiments will be more clearly understood from the following brief description taken in conjunction with the accompanying drawings. The accompanying drawings represent non-limiting, example embodiments as described herein.

FIGS. 4A through 11A are plan views illustrating a process of fabricating the TFT substrate of FIGS. 2 and 3.

FIGS. 4B through 11B are sectional view taken along line I-I' of FIGS. 4A through 11A, respectively, to illustrate the process of fabricating the TFT substrate of FIGS. 2 and 3.

FIGS. 12A through 12C are a table and graphs showing a result of an experiment that was performed to samples according to a comparative example.

Figure 1:
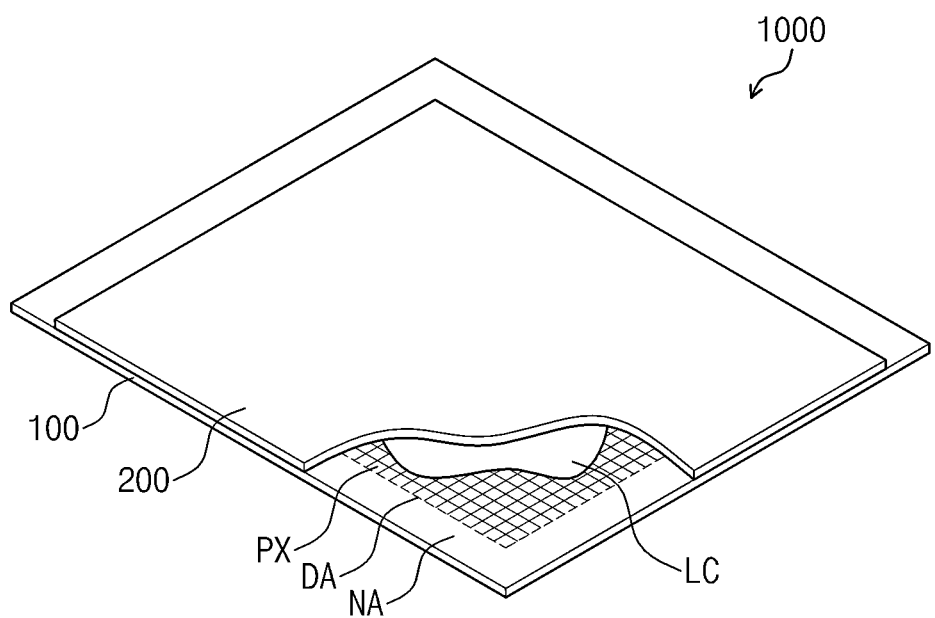
FIG. 1 is an exploded perspective view illustrating a display device including a thin-film transistor ("TFT") substrate according to example embodiments of the invention.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In an exemplary embodiment, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the invention will now be described more fully with reference to the accompanying drawings, in which example embodiments are shown. Example embodiments of the invention may, however, be embodied in many different forms and should not be construed as being limited to the embodiments set forth herein; rather, these embodiments are provided so that this invention will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. In an exemplary embodiment, when the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," when used herein, specify the presence of stated features, integers, steps, operations, elements and/or components, but do not preclude the presence or addition of one or more other features, integers, steps, operations, elements, components and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which example embodiments of the invention belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is an exploded perspective view illustrating a display device including a thin-film transistor ("TFT") substrate according to exemplary embodiments of the invention.

Referring to FIG. 1, a display device 1000 may include a TFT substrate 100, a counter substrate 200, and a liquid crystal layer LC disposed between the TFT substrate 100 and the counter substrate 200.

The TFT substrate 100 may include a display region DA and a non-display region NA. The display region DA may include a plurality of pixel regions PX, each of which includes a pixel used to display images. However, the whole area of the display region DA is not used to display images. In an exemplary embodiment, some regions of the display region DA are overlapped with a data line, a gate line, and a TFT, which will be described below, and are not used to display the image. The non-display region NA may be provided around the pixel region DA and may not be used to display the image.

In the TFT substrate 100, each pixel region PX may include a TFT and a pixel electrode. In an exemplary embodiment, the counter substrate 200 may include a common electrode.

In other exemplary embodiments, the TFT substrate 100 may be configured to include the TFT, the pixel electrode, and the common electrode, although not limited thereto.

The liquid crystal layer LC may include a plurality of liquid crystal molecules exhibiting dielectric anisotropy. When an electric field is applied between the pixel electrode and the common electrode, the liquid crystal molecules of the liquid crystal layer LC may be rotated between the TFT substrate 100 and the counter substrate 1000 and be oriented in a predetermined direction, and thus, it is possible to control transmittance of light incident into the liquid crystal layer LC.

Figure 2:
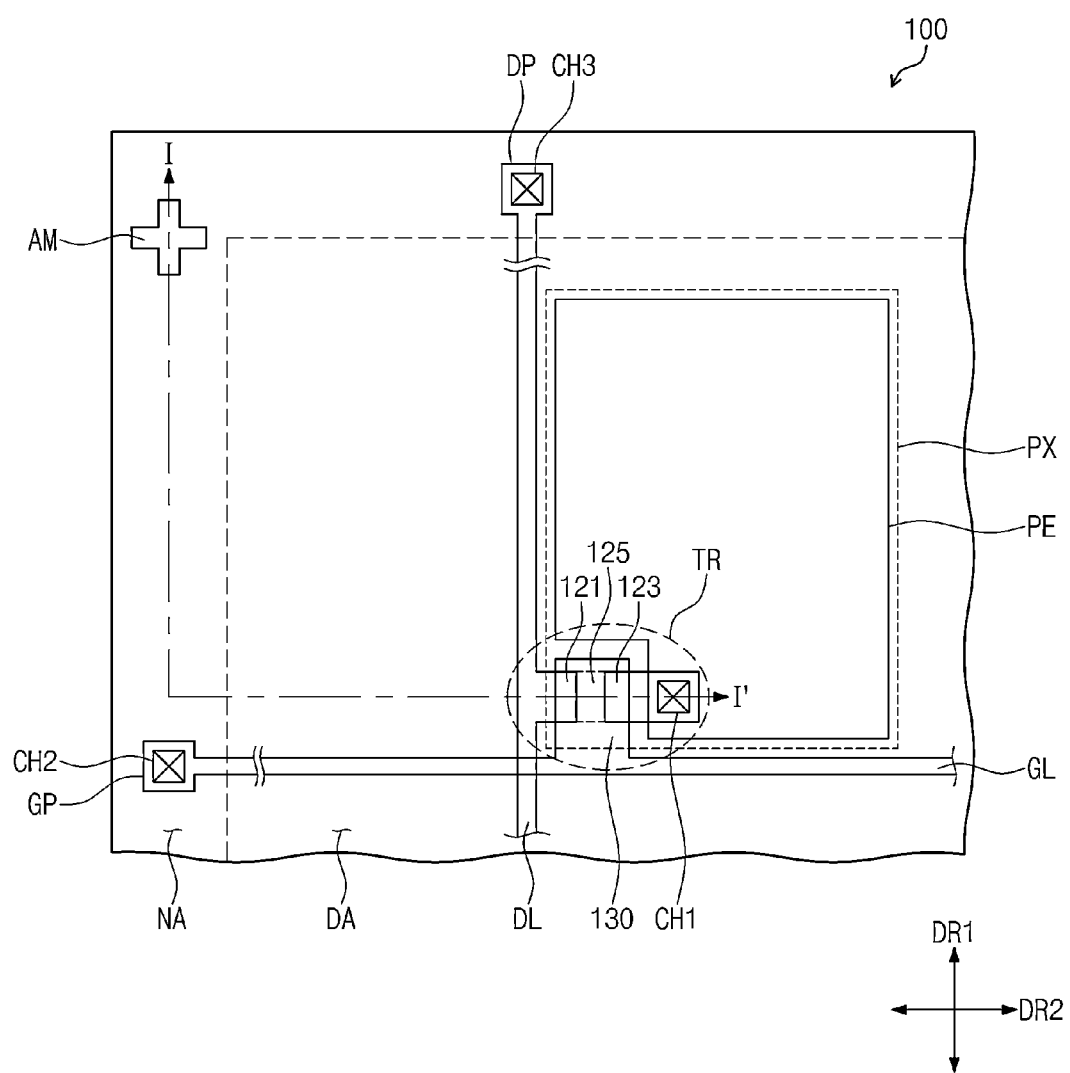
FIG. 2 is a plan view illustrating a portion of the TFT substrate of FIG. 1.
Figure 3:
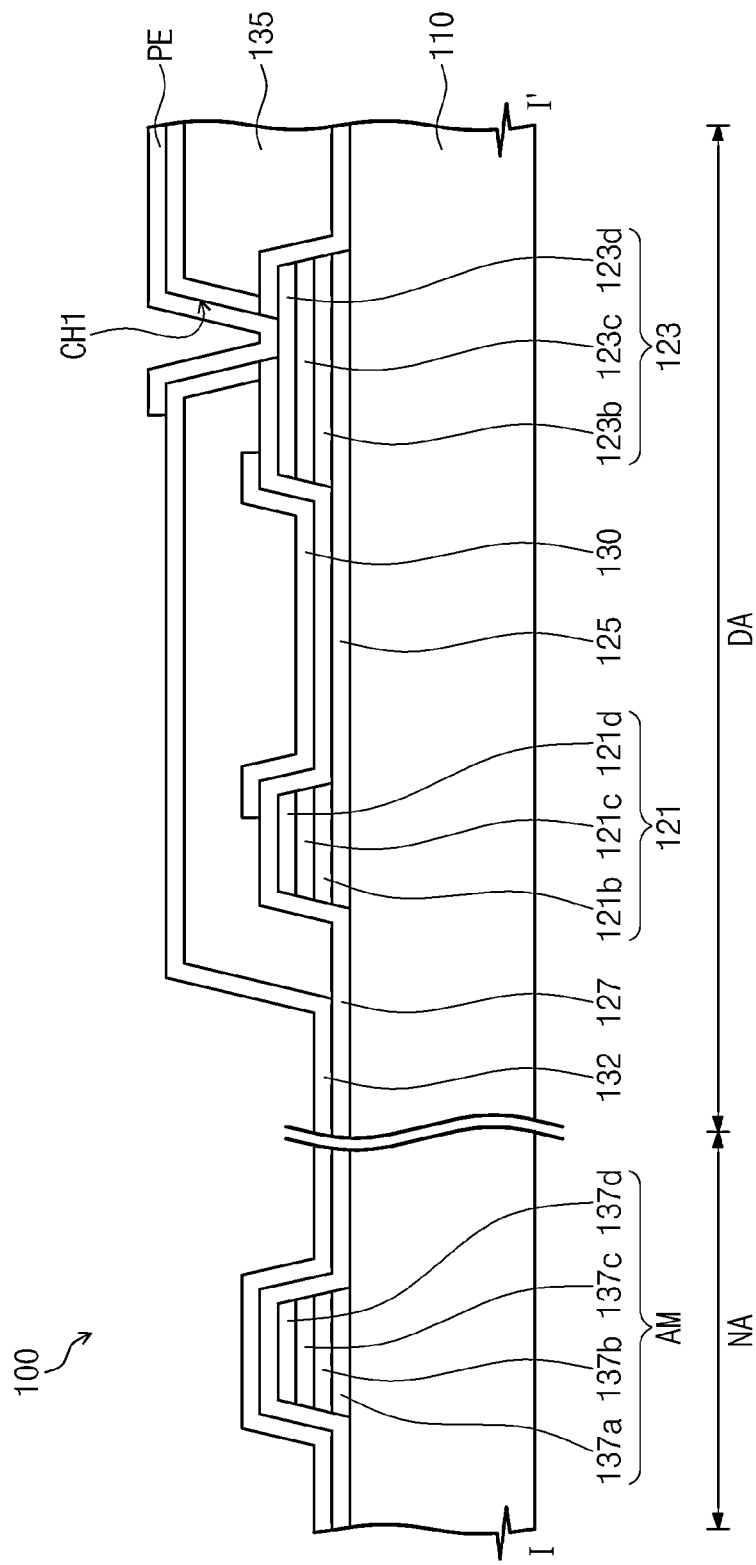
FIG. 3 is a sectional view taken along line I-I' of FIG. 2.

FIG. 2 is a plan view illustrating a portion of the TFT substrate 100 of FIG. 1, and FIG. 3 is a sectional view taken along line IT of FIG. 2.

Referring to FIGS. 1 through 3, the TFT substrate 100 may include an insulating substrate 110, a data line DL, a gate line GL, a TFT TR, a pixel electrode PE, an alignment mark AM, a gate pad GP, and a data pad DP.

In an exemplary embodiment, the insulating substrate 110 may include a transparent material (e.g., glass or plastic).

The data line DL may be provided on the insulating substrate 110 to extend in a first direction DR1. The gate line GL may extend in a second direction DR2 crossing the first direction DR1. The data line DL and the gate line GL may be provided to intersect each other and may be electrically separated from each other.

Although one data line DL and one gate line GL are exemplarily illustrated in FIG. 2, the TFT substrate 100 may be configured to include a plurality of data lines DL and a plurality of gate lines GL defining a plurality of pixel regions PX. However, the invention is not limited thereto, and the plurality of pixel regions PX may not be defined by the plurality of data lines DL and the plurality of gate lines GL.

The TFT TR may include a source electrode 121, a drain electrode 123, an oxide semiconductor pattern 125, and a gate electrode 130.

The oxide semiconductor pattern 125 may be disposed on the insulating substrate 110 to serve as an active layer of the TFT TR. The oxide semiconductor pattern 125 may be overlapped with the gate electrode 130 and is electrically connected to the source and drain electrodes 121 and 123.

The oxide semiconductor pattern 125 may include at least one of zinc (Zn), indium (In), tin (Sn), or gallium (Ga), for example. In an exemplary embodiment, the oxide semiconductor pattern 125 may include indium-gallium-zinc oxide ("IGZO"), for example.

The source electrode 121 may be provided in a form of a protrusion laterally extending a side of the data line DL. The drain electrode 123 is spaced apart from the source electrode 121.

Each of the source and drain electrodes 121 and 123 may include a barrier layer 121b or 123b, a main wiring layer 121c or 123c, and a capping layer 121d or 123d. In other words, each of the source and drain electrodes 121 and 123 may have a triple-layered structure.

In an exemplary embodiment, each of the barrier and capping layers 121b, 123b, 121d, and 123d may include or include at least one of vanadium (V), zirconium (Zr), tantalum (Ta), manganese (Mn), magnesium (Mg), chromium (Cr), molybdenum (Mo), cobalt (Co), niobium (Nb), and nickel (Ni), copper alloys, at least one of metal oxides (such as indium-zinc oxide, gallium-zinc oxide, and aluminum-zinc oxide), or any combinations thereof. In an exemplary embodiment, the main wiring layers 121c and 123c may include a metallic material (for example, copper (Cu) or copper alloys).

The barrier layers 121b and 123b may prevent a material (e.g., copper) from being diffused from the main wiring layers 121c and 123c into the oxide semiconductor pattern 125. The capping layers 121d and 123d may prevent metallic elements of the main wiring layers 121c and 123c from having a changed property (for example, by chemical reaction), and this makes it possible to prevent electrical or structural properties of the TFT from being deteriorated.

In other exemplary embodiments, each of the source and drain electrodes 121 and 123 may have a double-layered structure having the barrier layer 121b or 123b and the main wiring layer 121c or 123c, without the capping layer 121d or 123d, or having the main wiring layer 121c or 123c and the capping layer 121d or 123d, without the barrier layer 121b or 123b, although not limited thereto.

The TFT substrate 100 may further include a first insulating layer 127 provided on the source and drain electrodes 121 and 123. In an exemplary embodiment, the first insulating layer 127 may include an insulating material, such as silicon oxide (SiOx) or silicon nitride (SiNx). The first insulating layer 127 may separate the source and drain electrodes 121 and 123 electrically from the gate electrode 130.

The gate electrode 130 may be provided as a protrusion laterally protruding from the gate line GL. The gate electrode 130 may be disposed on the first insulating layer 127 and be overlapped with the oxide semiconductor pattern 125.

Each of the gate electrode 130 and the gate line GL may have a single-layered or multi-layered structure. In an exemplary embodiment, each of the gate electrode 130 and the gate line GL may include at least one layer including at least one of aluminum-based metals (e.g., aluminum (Al) or aluminum alloys), silver-based metals (e.g., silver (Ag) or silver alloys), copper-based metals (e.g., copper (Cu) or copper alloys), molybdenum-based metals (e.g., molybdenum (Mo) or molybdenum alloys), chromium (Cr), titanium (Ti), tantalum (Ta), or manganese (Mn), for example.

A second insulating layer 132 may be disposed on the first insulating layer 127 and the gate electrode 130. The second insulating layer 132 may include an insulating material, such as silicon oxide (SiOx) or silicon nitride (SiNx). The second insulating layer 132 may electrically separate the gate electrode 130 from the pixel electrode PE.

The TFT substrate 100 may further include a color filter 135 provided between the first insulating layer 127 and the second insulating layer 132. The color filter 135 may be disposed on the gate electrode 130 and the first insulating layer 127. The color filter 135 may be configured in such a way that light passing through the pixel region PX can have a wavelength corresponding to a proper color of the pixel region PX. Although not shown, the color filter 135 may include a red color filter, a green color filter, and a blue color filter, for example. However, the invention is not limited thereto, and the color filter 135 may have various other colors.

A first contact hole CH1 may be defined in the first insulating layer 127 and the second insulating layer 132 to partially expose a top surface of the drain electrode 123.

The pixel electrode PE may be disposed on the first insulating layer 127 and the second insulating layer 132 to cover the first contact hole CH1. The pixel electrode PE may be electrically connected to the drain electrode 123 through the first contact hole CH1. The pixel electrode PE may be applied with a data voltage via the drain electrode 123.

In an exemplary embodiment, the pixel electrode PE may be a transparent electrode (e.g., of indium tin oxide ("ITO") or indium zinc oxide ("IZO")).

The alignment mark AM may be disposed on and overlapped with the non-display region NA. The alignment mark AM may include a first layer 137a and mark layers 137b, 137c, and 137d. The first layer 137a may be provided in the same layer as the oxide semiconductor pattern 125, and include the same material as that of the oxide semiconductor pattern 125.

The mark layers may include second to fourth layers 137b, 137c, and 137d. The second layer 137b may be provided on the first layer 137a. The second layer 137b may be provided in the same layer as the barrier layers 121b and 123b, and include the same material as that of the barrier layers 121b and 123b. The second layer 137c may be provided on the second layer 137b. The third layer 137c may be provided in the same layer as the main wiring layer 121c and 123c, and include the same material as that of the main wiring layer 121c and 123c. The fourth layer 137d may be provided on the third layer 137d. The fourth layer 137d may be provided in the same layer as the capping layer 121d and 123d, and include the same material as that of the capping layer 121d and 123d.

In an exemplary embodiment, when the source and drain electrodes 121 and 123 are configured not to have one of the barrier and capping layers 121b, 123b, 121d, and 123d, the alignment mark AM may be configured not to have a corresponding one of the second layer 137b and the fourth layer 137d, for example.

The gate pad GP may be provided at an end of the gate line GL and be overlapped with the non-display region NA. The gate pad GP may be provided in the same vertical height as that of the gate line GL and the gate electrode 130 in a cross section. A gate signal input from an external or other source may be transmitted to the gate electrode 130 via the gate pad GP and the gate line GL. A second contact hole CH2 partially exposing a top surface of the gate pad GP may be defined in the second insulating layer 132.

The data pad DP may be provided at an end of the data line DL and be overlapped with the non-display region NA. The data pad DP may be provided in the same vertical height as that of the data line DL, the source electrode 121, and the drain electrode 123 in a cross section. A data voltage input from an external or other source may be transmitted to the source electrode 121 via the data pad DP and the data line DL. A third contact hole CH3 partially exposing a top surface of the data pad DP may be defined in the first insulating layer 127 and the second insulating layer 132.

According to exemplary embodiments of the invention, in the display device 1000, the alignment mark AM may include the first to fourth layers 137a, 137b, 137c, and 137d, and the second to fourth layer 137b, 137c, and 137d may be provided on the first layer 137a having the same vertical height as that of the oxide semiconductor pattern 125 in a cross section. Accordingly, the alignment mark AM can be provided after performing a thermal treatment process to the oxide semiconductor pattern 125, and thus, it is possible to prevent the alignment mark AM from being shrunk by a thermal treatment process. As a result, it is possible to prevent misalignment from occurring between the TFT substrate 100 and the counter substrate 200.

FIG. 4A, FIG. 5A, FIG. 6A, FIG. 7A, FIG. 8A, FIG. 9A, FIG. 10A, and FIG. 11A are plan views illustrating respective operations of a process of fabricating the TFT substrate shown in FIGS. 2 and 3.

FIG. 4B, FIGS. 5B through 5E, FIG. 6B, FIG. 7B, FIG. 8B, FIG. 9B, FIG. 10B, and FIG. 11B are sectional view taken along line I-I' of FIG. 4A, FIG. 5A, FIG. 6A, FIG. 7A, FIG. 8A, FIG. 9A, FIG. 10A, and FIG. 11A, respectively, to illustrate respective operations of the process of fabricating the TFT substrate shown in FIGS. 2 and 3.

Figure 4A:
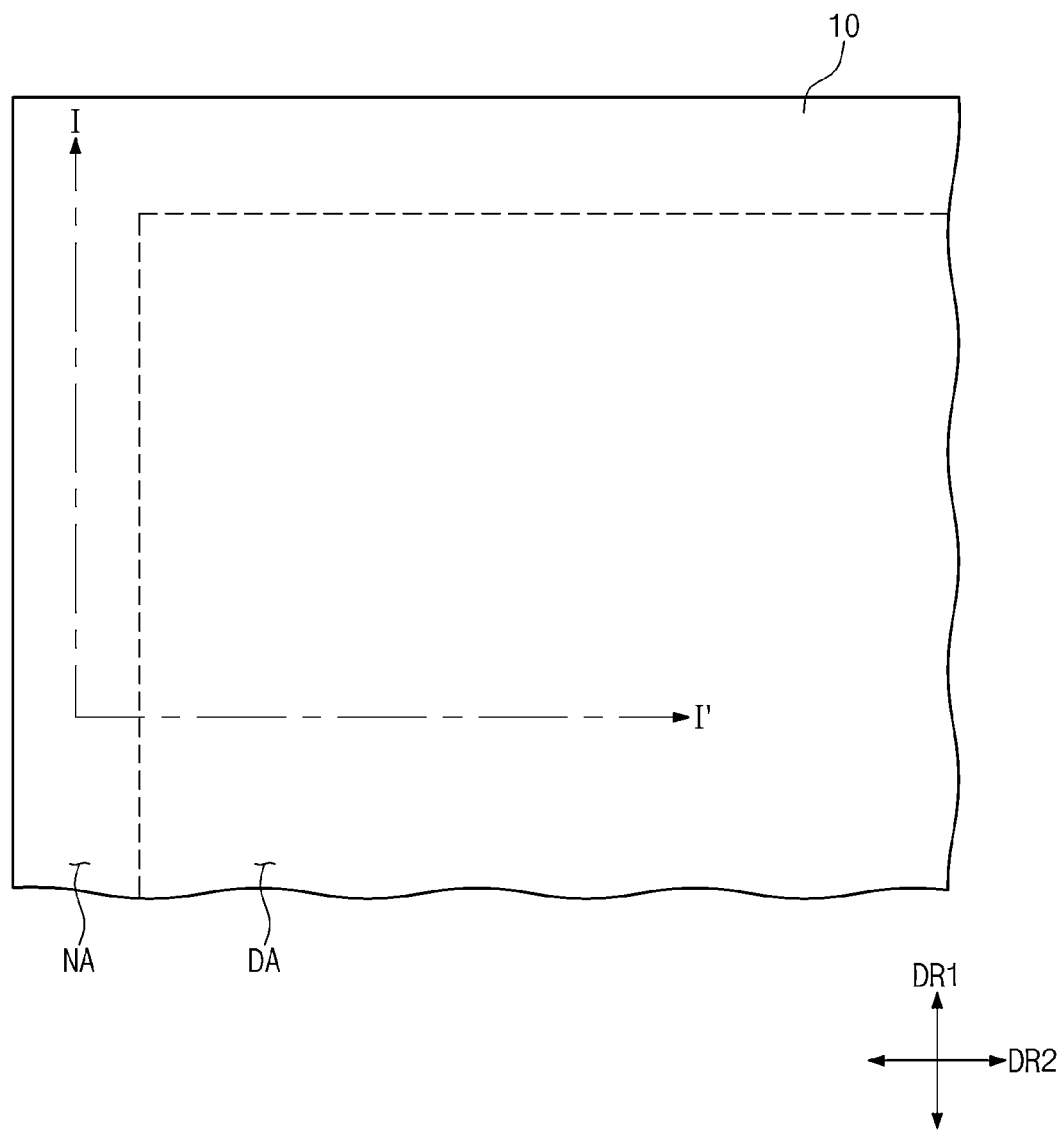
Figure 4B:
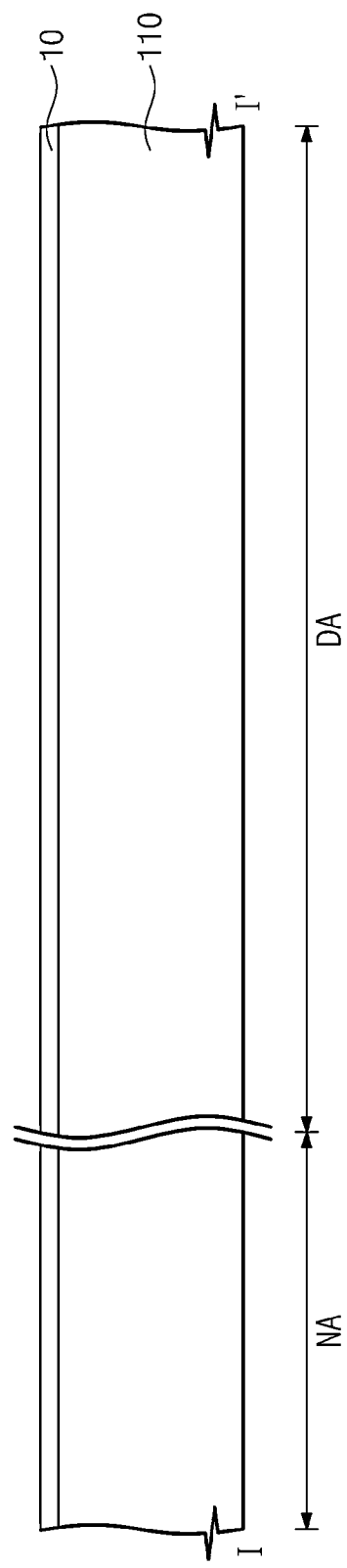

Referring to FIGS. 4A and 4B, an oxide semiconductor layer 10 may be disposed on the insulating substrate 110 (e.g., including transparent glass or plastic), using a deposition process, for example. In an exemplary embodiment, the oxide semiconductor layer 10 may include at least one of zinc (Zn), indium (In), tin (Sn), or gallium (Ga), for example. In an exemplary embodiment, the oxide semiconductor layer 10 may include IGZO, for example. The insulating substrate 110 may include the display region DA and the non-display region NA.

Thereafter, a thermal treatment process may be performed to the structure with the oxide semiconductor layer 10.

In an exemplary embodiment, the thermal treatment process may be performed at a high temperature of about 350 degrees Celsius (° C.) or higher for one hour or more, for example. As the result of the thermal treatment process, the oxide semiconductor layer 10 may have an improved semiconductor property and thus a portion of the oxide semiconductor layer 10 can be used as a channel region of the TFT.

The thermal treatment process may lead to shrinkage of the insulating substrate 110. Nevertheless, since the oxide semiconductor layer 10 covers the whole top surface of the insulating substrate 110 and the thermal treatment process is performed before a patterning process thereof, it is possible to prevent patterns, which will be provided in subsequent processes, from being affected by the shrinkage of the insulating substrate 110.

Figure 5A:
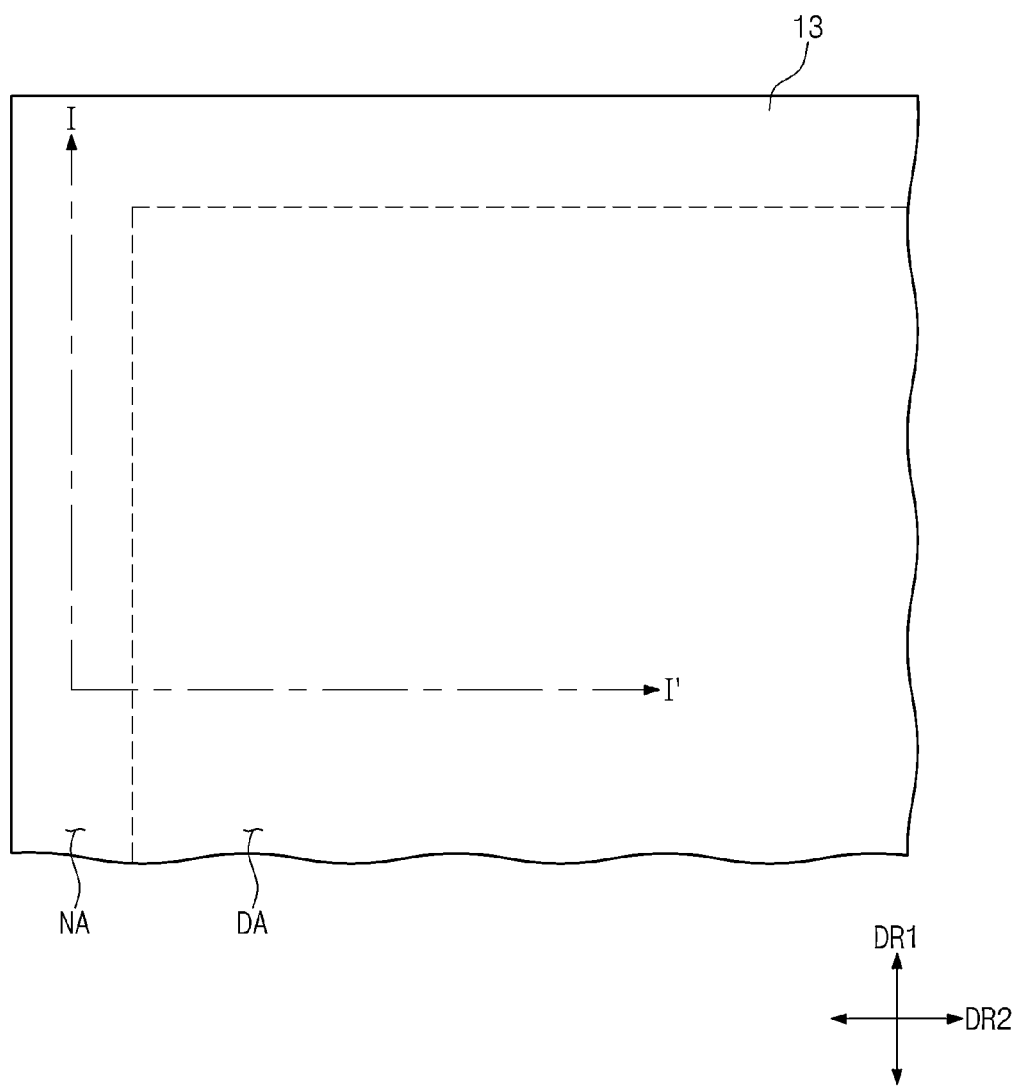
Figure 5B:
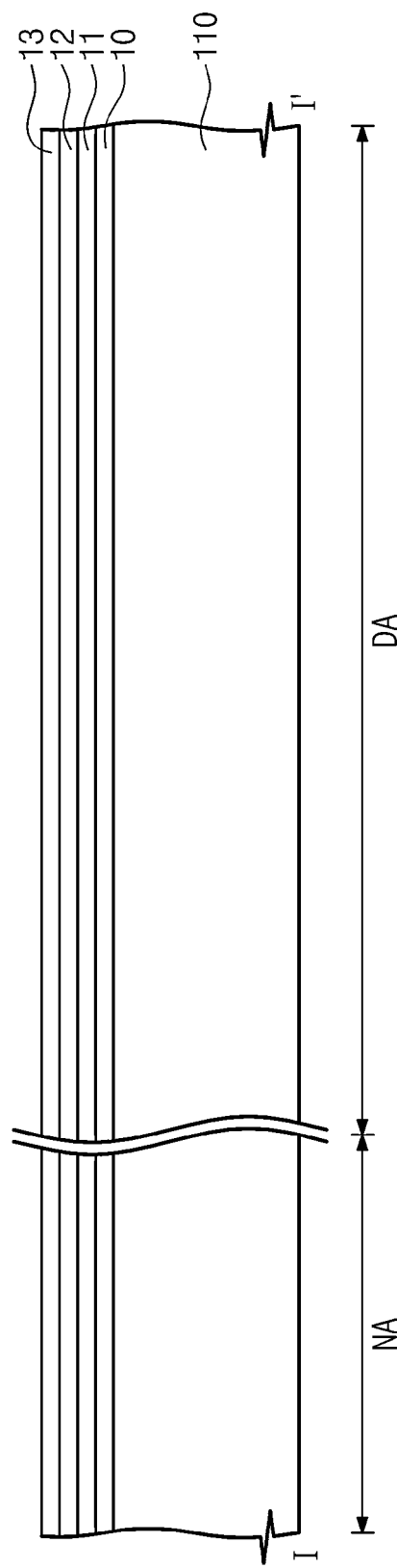

Referring to FIGS. 5A and 5B, a first material layer 11, a second material layer 12, and a third material layer 13 may be disposed on the oxide semiconductor layer 10, using a deposition process, for example. In an exemplary embodiment, each of the first and third material layers 11 and 13 may include at least one of vanadium (V), zirconium (Zr), tantalum (Ta), manganese (Mn), magnesium (Mg), chromium (Cr), molybdenum (Mo), cobalt (Co), niobium (Nb), and nickel (Ni), copper alloys, or at least one of metal oxides (such as indium-zinc oxide, gallium-zinc oxide, and aluminum-zinc oxide), for example. The second material layer 12 may include a metallic material (for example, copper (Cu) or copper alloys).

Figure 5C:
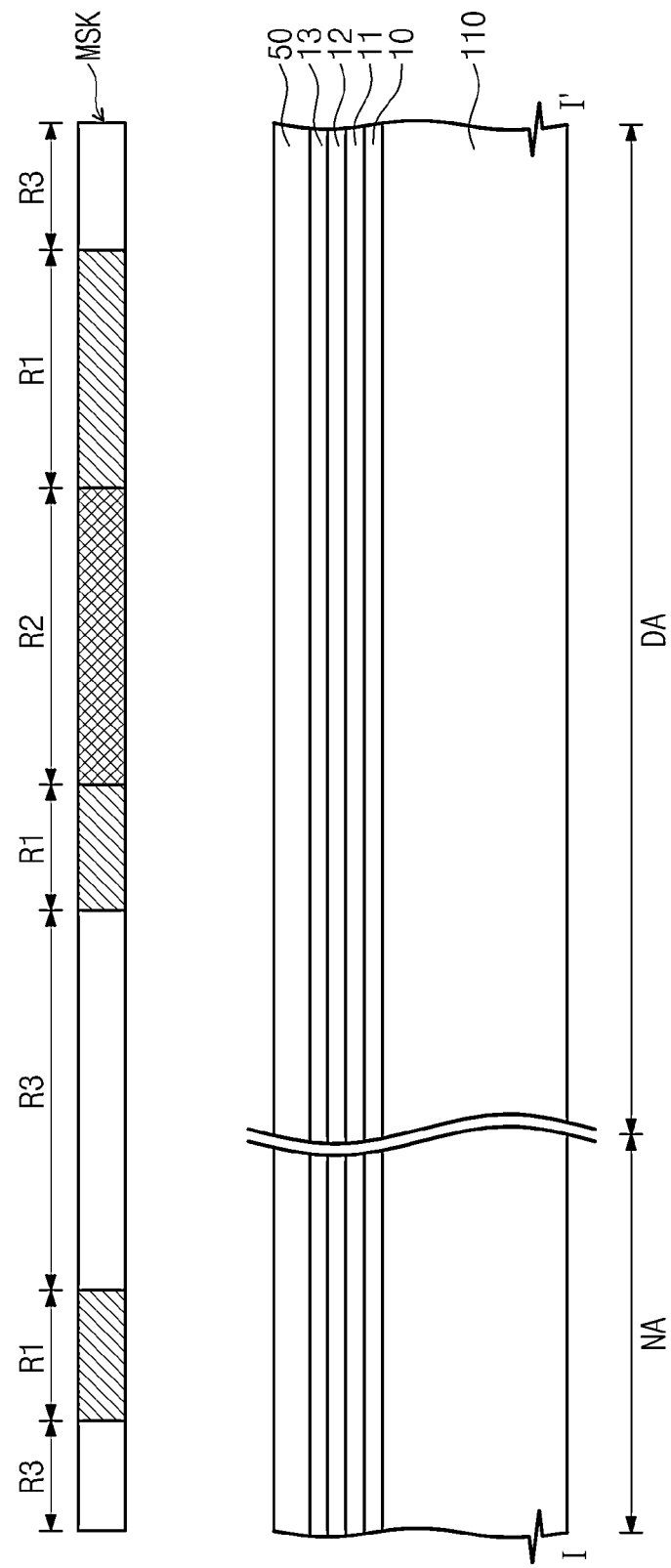

Referring to FIG. 5C, a photosensitive film 50 including a photosensitive material may be disposed on the third material layer 13. Thereafter, light may be irradiated to the photosensitive film 50 using a mask MSK as a photomask. In an exemplary embodiment, the mask MSK may be a halftone mask including a first region R1 preventing the light from passing therethrough, a second region R2 allowing a fraction of the light to transmit therethrough, and a third region R3 allowing most of the light to transmit therethrough. Some regions of the photosensitive film 50 may be selectively exposed by a fraction of an incident light passing through the mask MSK.

Figure 5D:
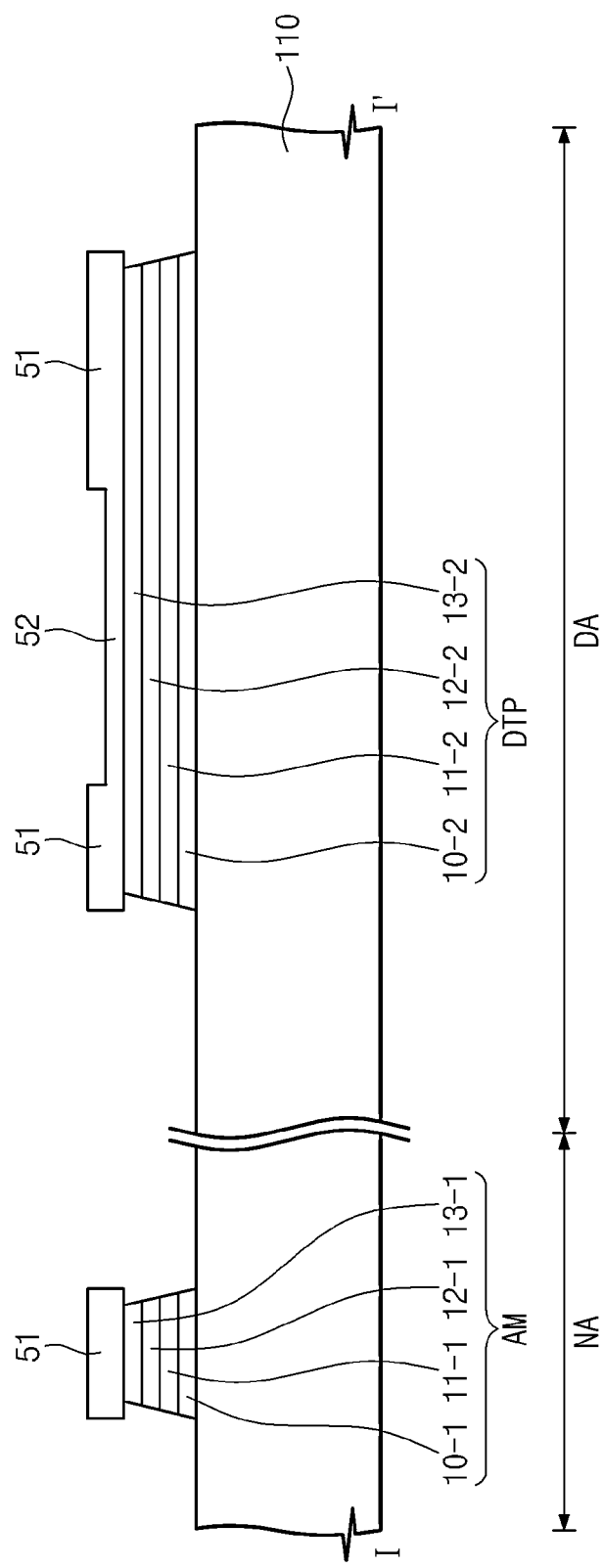

After the exposing operation, a developing operation is performed to the photosensitive film 50 to provide first and second photosensitive films portions 51 and 52 at positions defined by the first and second regions R1 and R2, respectively, as shown in FIG. 5D. As the result of the developing operation, portions of the photosensitive film 50 corresponding to the third region R3 may be removed to partially expose the top surface of the insulating substrate 110.

Since an intensity of the light to be incident into the photosensitive film 50 is larger on the second region R2 than on the first region R1, a remaining thickness of the second photosensitive film portion 52 may be smaller than that of the first photosensitive film portion 51.

In exemplary embodiments, a positive-type photoresist may be used for the photosensitive film 50, as described above. That is, the photosensitive film 50 includes a material, and exposed portions thereof are removed in the developing operation, but the invention may not be limited thereto. In other exemplary embodiments, the photosensitive film 50 may include a negative-type photoresist, and un-exposed portions thereof are removed in the developing operation, for example.

The oxide semiconductor layer 10 and the first to third material layers 11, 12, and 13 may be selectively etched using the first and second photosensitive film portions 51 and 52 as an etch mask. Here, the etching operation may be performed using a first etching solution capable of etching the oxide semiconductor layer 10 and the first to third material layers 11, 12, and 13. As the result of the etching operation, the alignment mark AM and a data pattern DTP may be disposed on the insulating substrate 110. The alignment mark AM may include a patterned oxide semiconductor layer 10-1 and first to third patterned material layers 11-1, 12-1, and 13-1. Here, the data pattern DTP may include the patterned oxide semiconductor layer 10-2 and the first to third patterned material layers 11-2, 12-2, and 13-2.

The alignment mark AM may be covered with the first photosensitive film portion 51, and the data pattern DTP may be covered with the first photosensitive film portion 51 and the second photosensitive film portion 52. A portion of the data pattern DTP covered with the second photosensitive film portion 52 may serve as a channel region in a TFT that will be provided by subsequent processes.

Figure 5E:
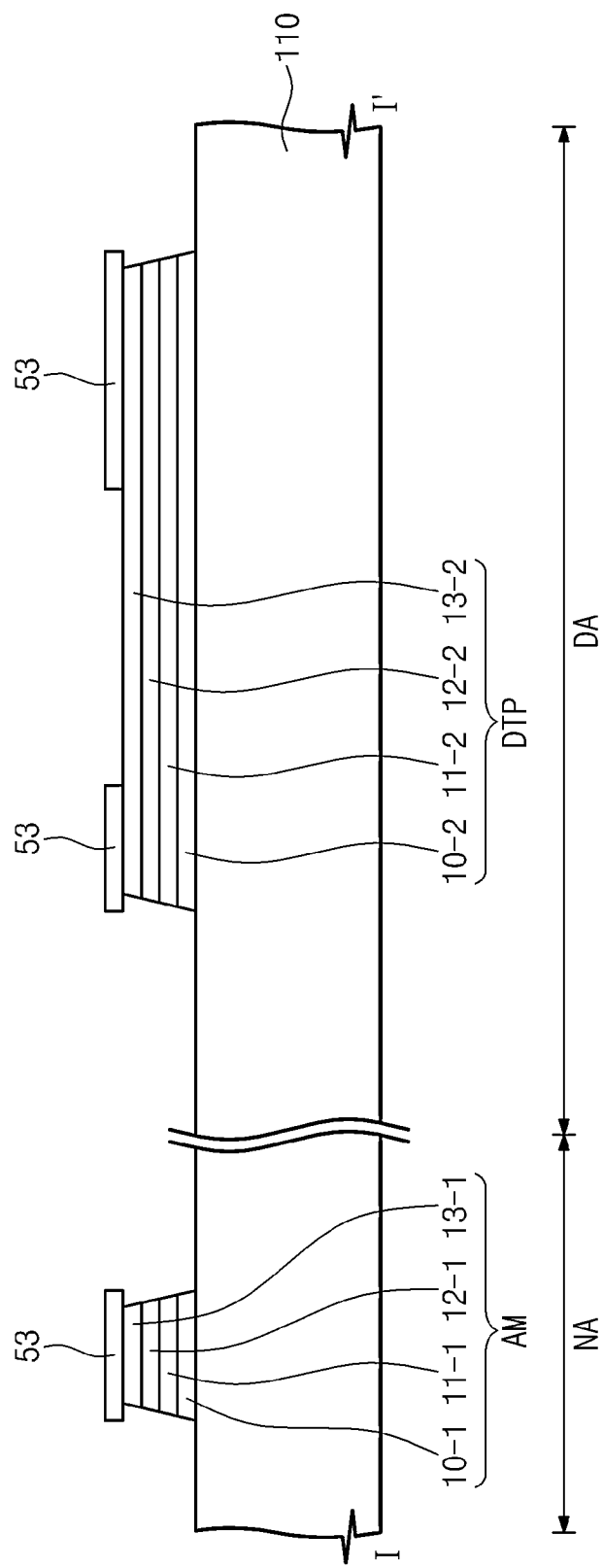

Thereafter, a portion of the first photosensitive film portion 51 and the second photosensitive film portion 52 may be removed by an ashing or etch-back process, for example, and thus, as shown in FIG. 5E, the second photosensitive film portion 52 may be fully removed to expose a portion of the top surface of the data pattern DTP. Here, a portion of the first photosensitive film portion 51 may be removed to provide the third photosensitive film portion 53.

A portion of the data pattern DTP, which is not covered with the third photosensitive film portion 53, may be selectively removed using a second etching solution. In an exemplary embodiment, the first to third material layers 11-2, 12-2, and 13-2 of the data pattern DTP may be selectively etched, while the oxide semiconductor layer 10-2 is not etched in the etching operation. In an exemplary embodiment, the second etching solution may be a different material from the first etching solution. The second etching solution may be selected from etchants capable of etching the first to third material layers 11-2, 12-2, and 13-2 but preventing or suppressing the oxide semiconductor layer 10 from being etched.

Thereafter, the third photosensitive film portion 53 may be removed.

Figure 6A:
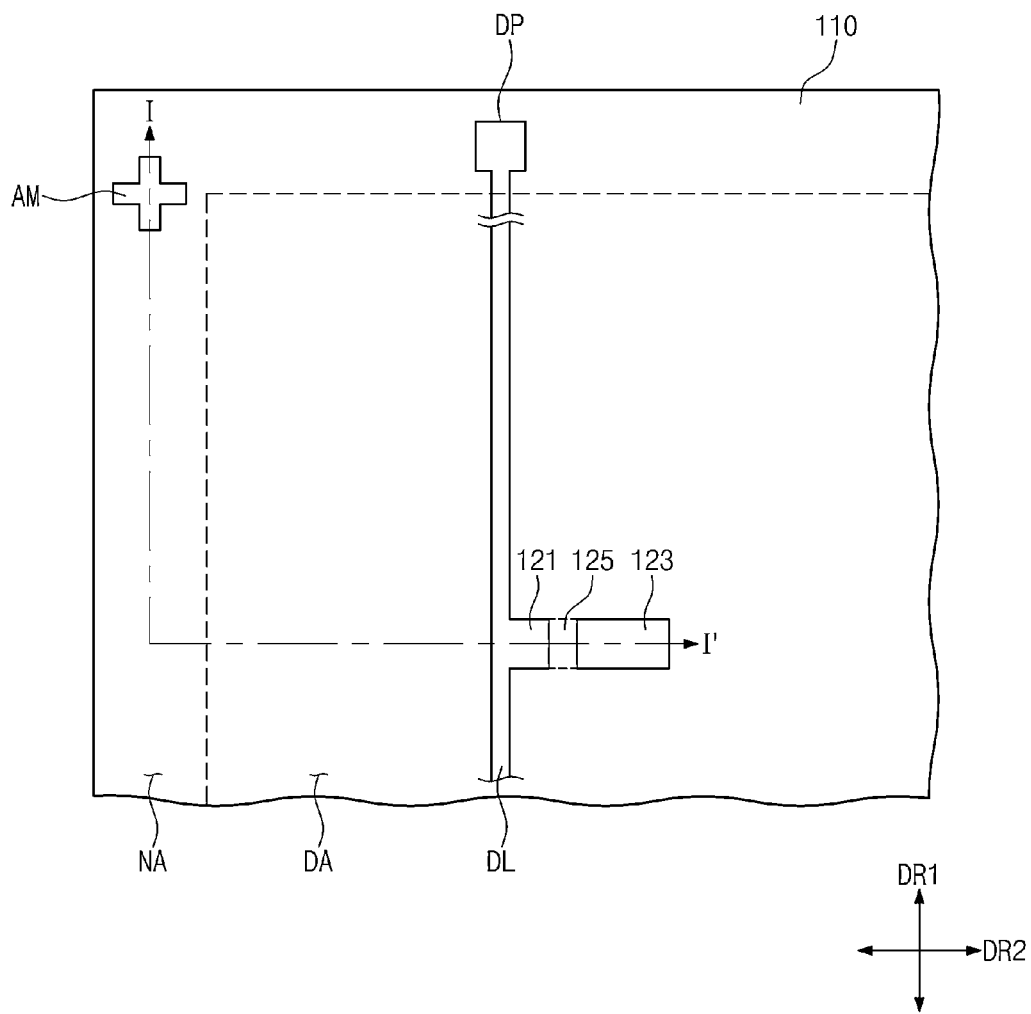

Referring to FIGS. 6A and 6B, the source electrode 121, the drain electrode 123, the data line DL, the oxide semiconductor pattern 125, and the data pad DP are provided. Here, the alignment mark AM and the data pad DP may be disposed on and overlapped with the non-display region NA.

Each of the source and drain electrodes 121 and 123 may include a barrier layer 121b or 123b, a main wiring layer 121c or 123c, and a capping layer 121d or 123d. In other words, each of the source and drain electrodes 121 and 123 may have a triple-layered structure, for example.

Figure 7A:
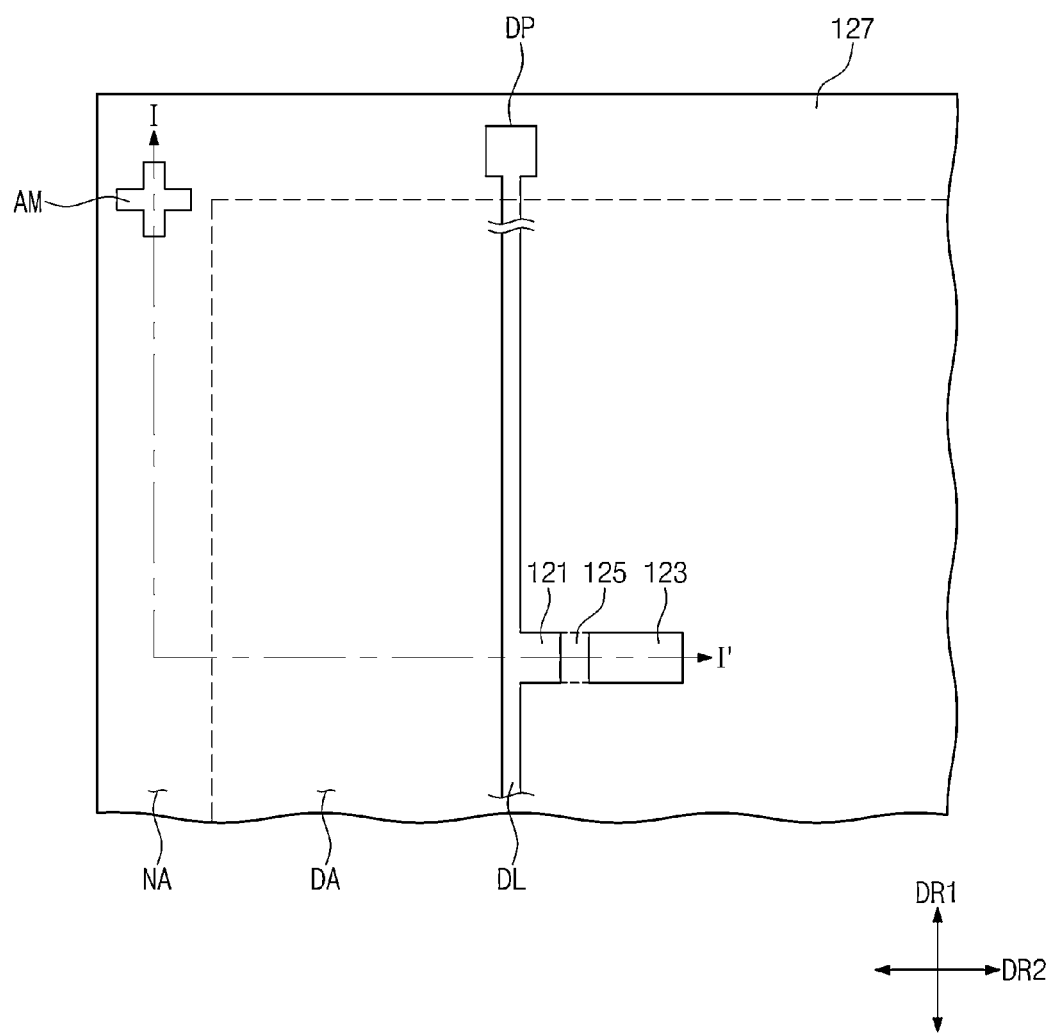
Figure 7B:
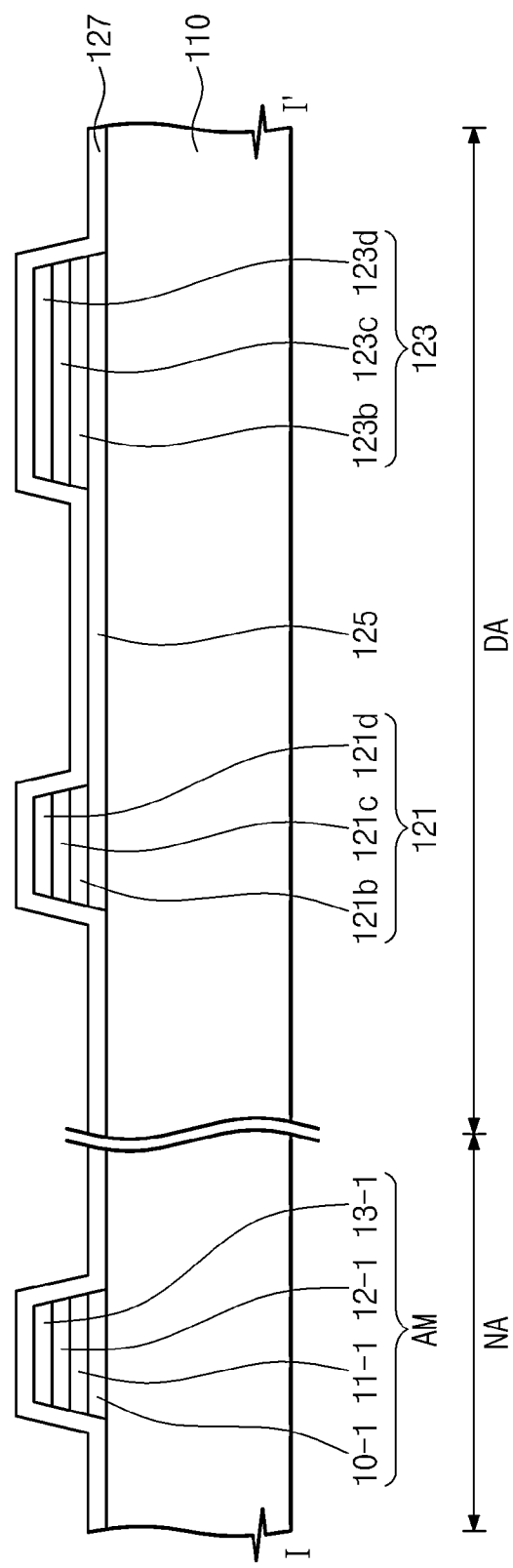

Referring to FIGS. 7A and 7B, the first insulating layer 127 may be disposed on the alignment mark AM, the source electrode 121, the drain electrode 123, the oxide semiconductor pattern 125, and the data pad DP.

In an exemplary embodiment, the first insulating layer 127 may be provided by depositing an insulating material (e.g., silicon oxide (SiOx) or silicon nitride (SiNx)).

Figure 8A:
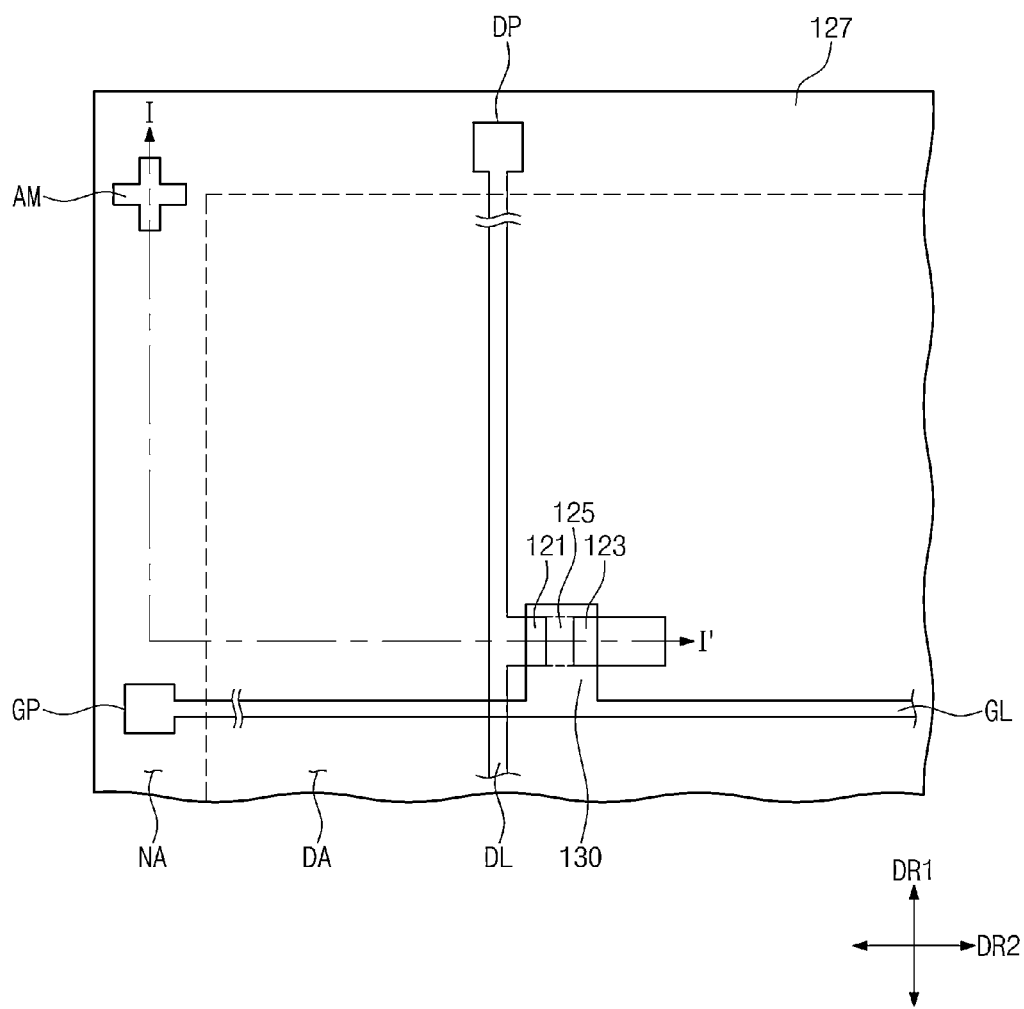
Figure 8B:
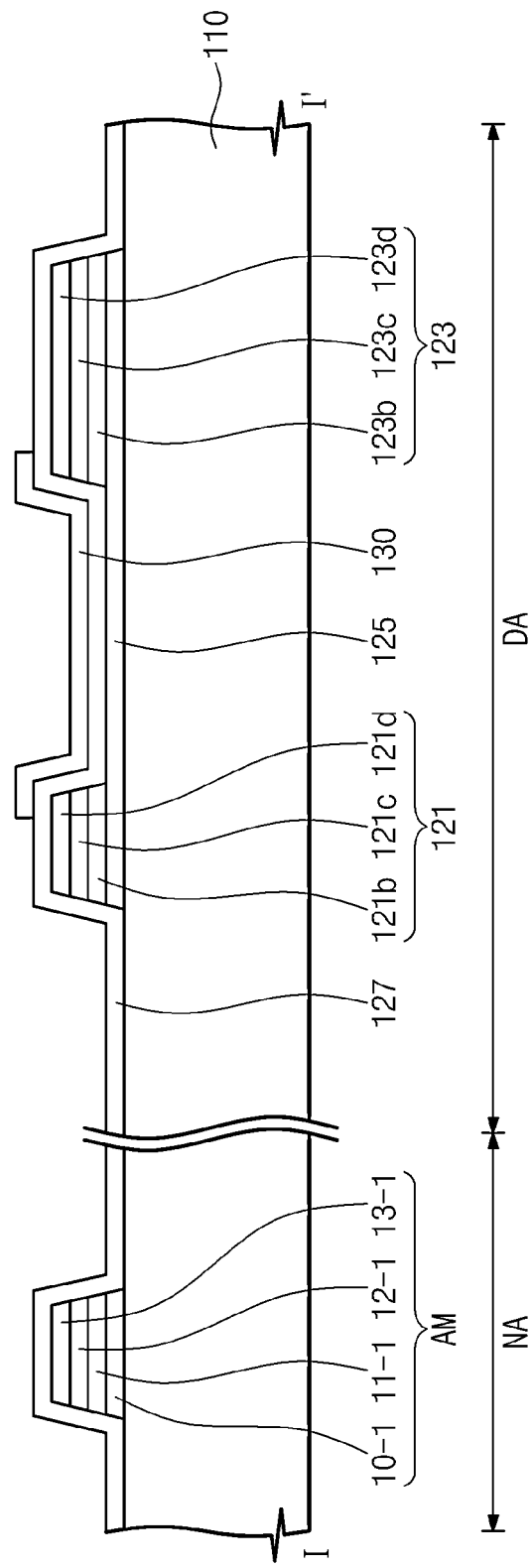

Referring to FIGS. 8A and 8B, the gate electrode 130, the gate line GL, and the gate pad GP may be disposed on the first insulating layer 127.

The gate line GL may cross the data line DL, and the gate electrode 130 may be disposed on and overlapped with the oxide semiconductor pattern 125. In exemplary embodiments, each of the gate line GL, the gate electrode 130, and gate pad GP may have a single-layered or multi-layered structure. Each of the gate line GL, the gate electrode 130, and the gate pad GP may include at least one layer including at least one of aluminum-based metals (e.g., aluminum (Al) or aluminum alloys), silver-based metals (e.g., silver (Ag) or silver alloys), copper-based metals (e.g., copper (Cu) or copper alloys), molybdenum-based metals (e.g., molybdenum (Mo) or molybdenum alloys), chromium (Cr), titanium (Ti), tantalum (Ta), and manganese (Mn).

Figure 9A:
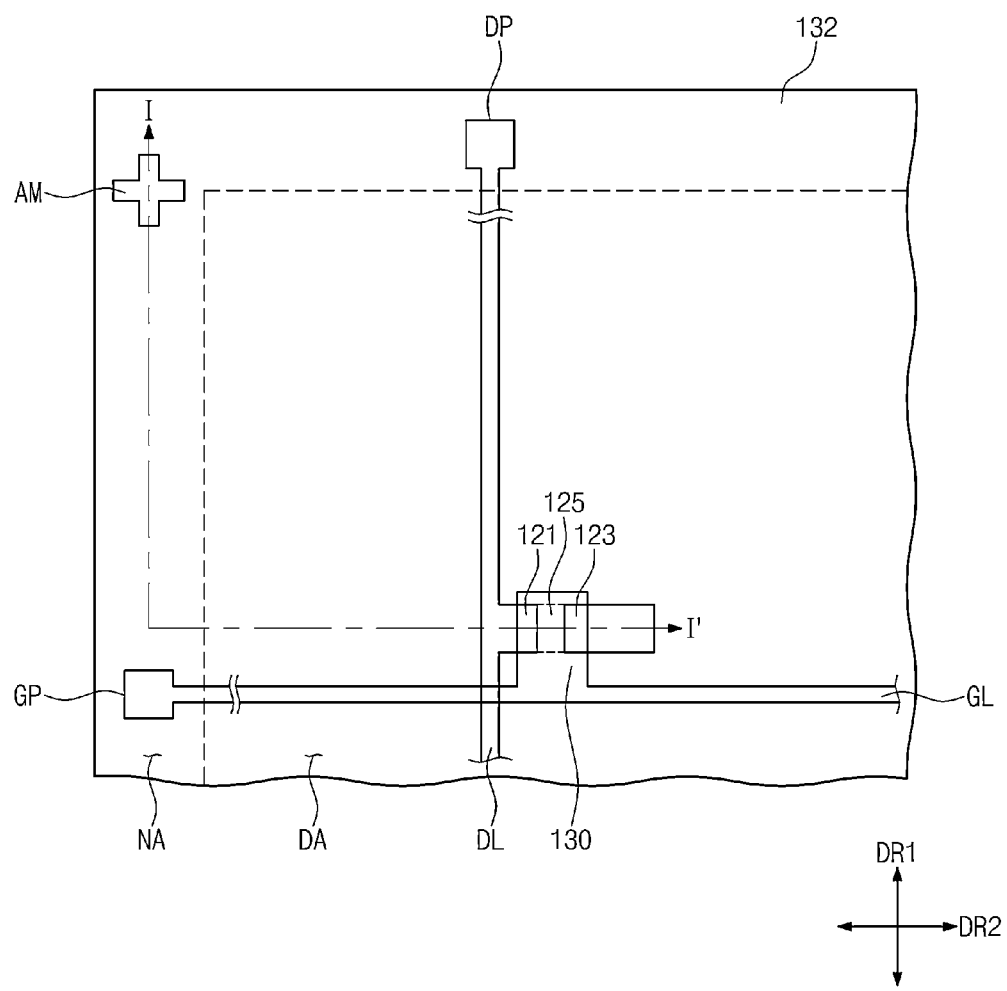
Figure 9B:
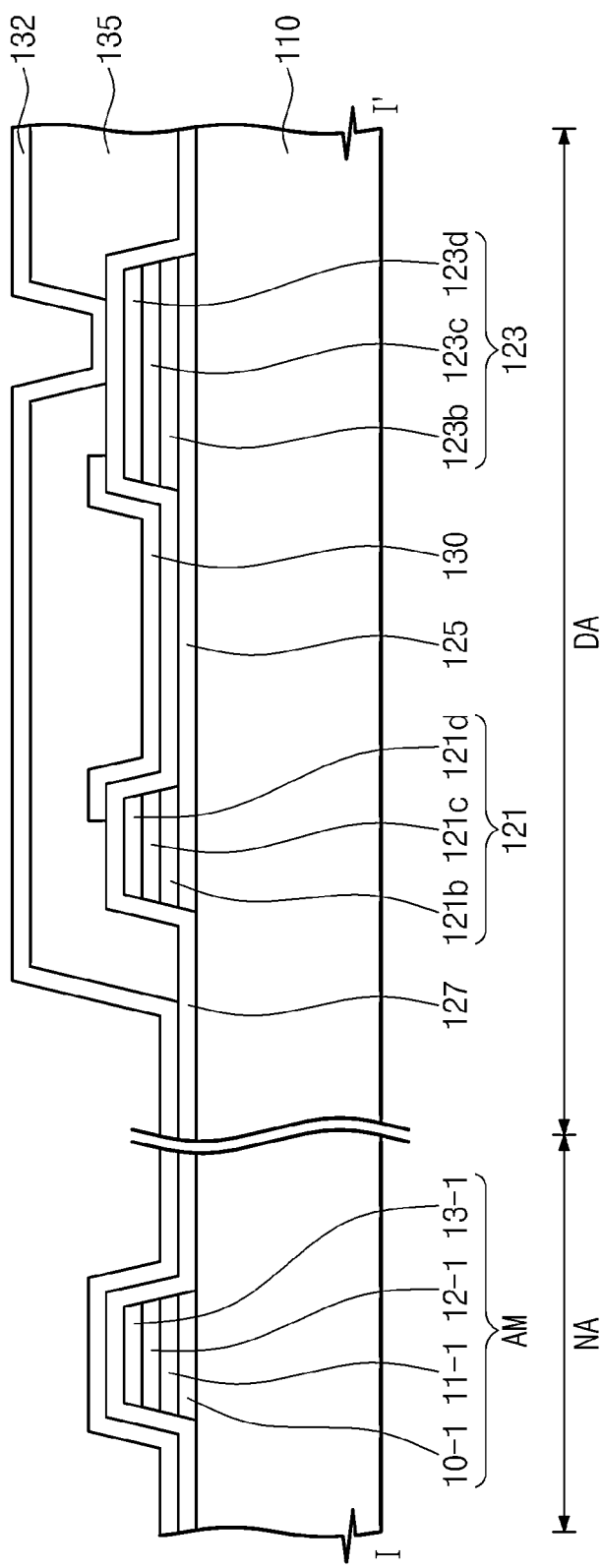

Referring to FIGS. 9A and 9B, the color filter 135 may be disposed on the first insulating layer 127. In an exemplary embodiment, the color filter 135 may be provided by depositing and patterning a color organic layer, for example.

Thereafter, the second insulating layer 132 may be disposed on the color filter 135. In an exemplary embodiment, the second insulating layer may be provided by depositing an insulating material (e.g., silicon oxide (SiOx) or silicon nitride (SiNx)).

Figure 10A:
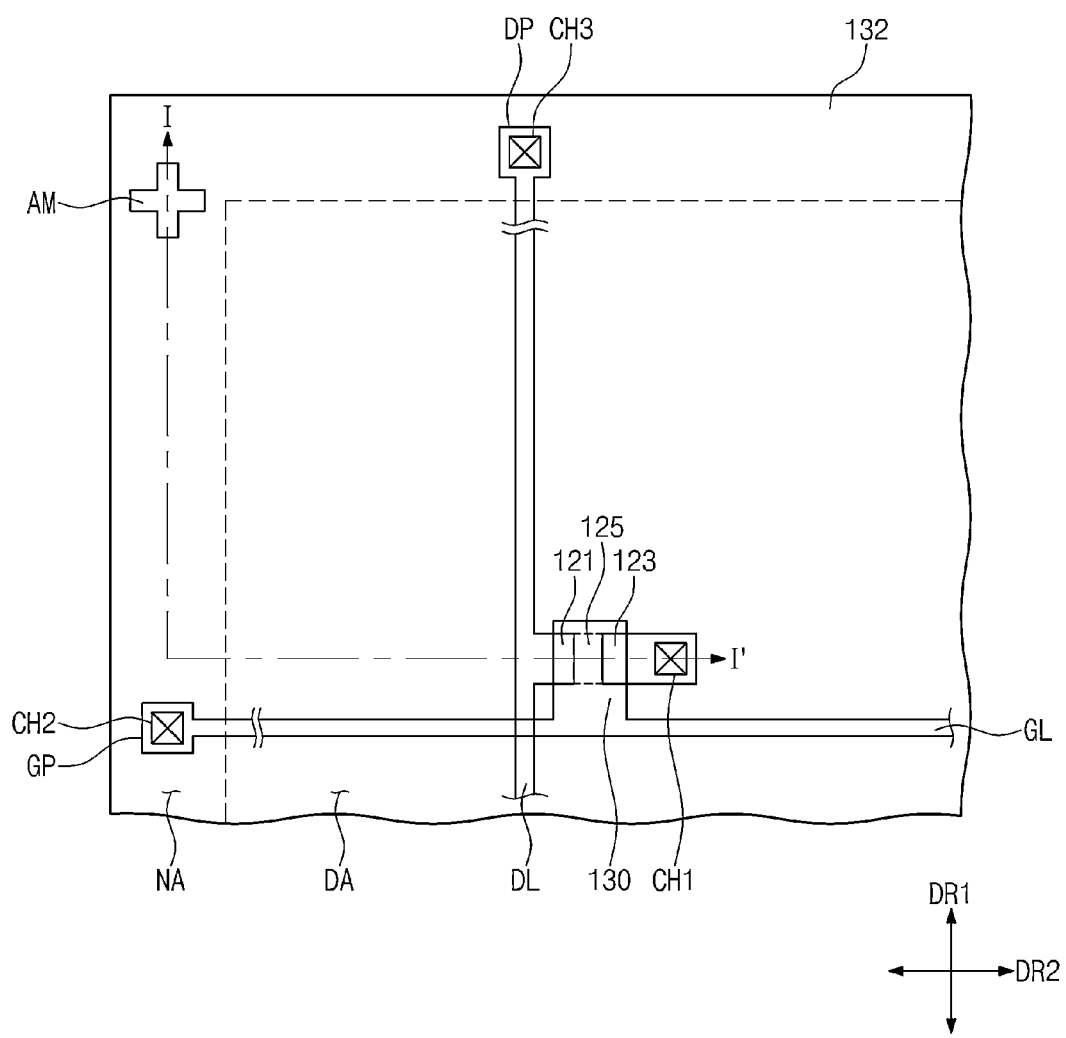
Figure 10B:
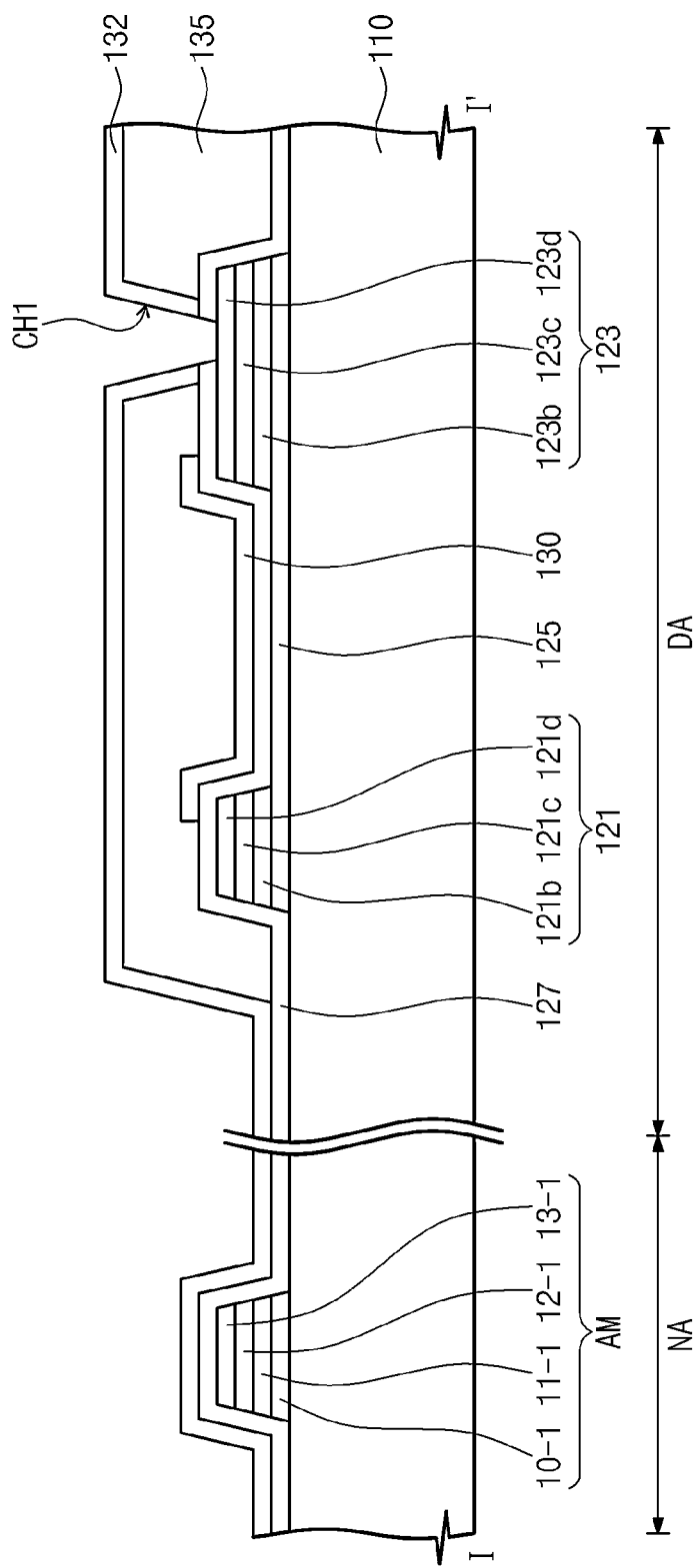

Referring to FIGS. 10A and 10B, the first and second insulating layers 127 and 132 overlapped with the drain electrode 123 may be partially etched to define the first contact hole CH1. Further, the first insulating layer 127 overlapped with the gate pad GP may be partially removed to define the second contact hole CH2, and the first and second insulating layers 127 and 132 may be partially etched to define the third contact hole CH3.

Figure 11A:
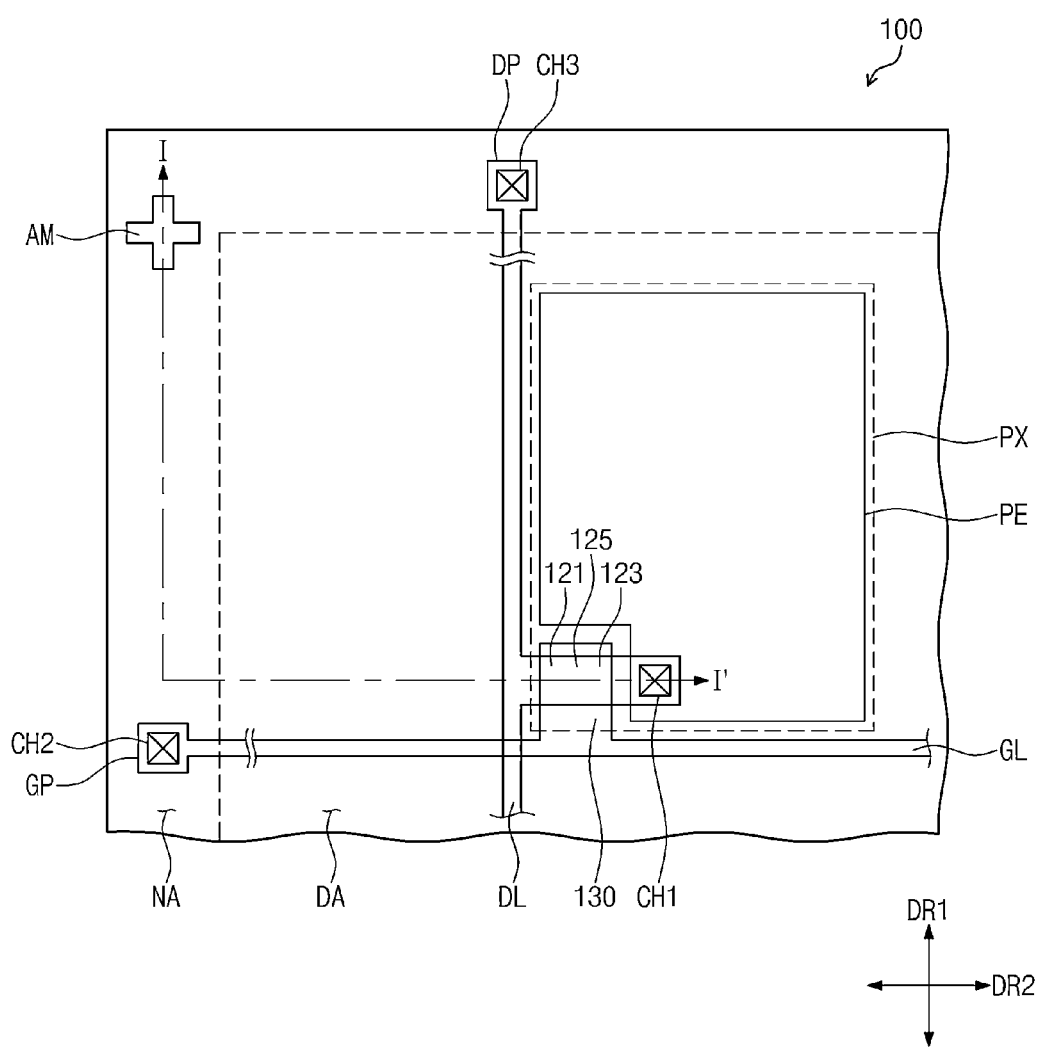
Figure 11B:
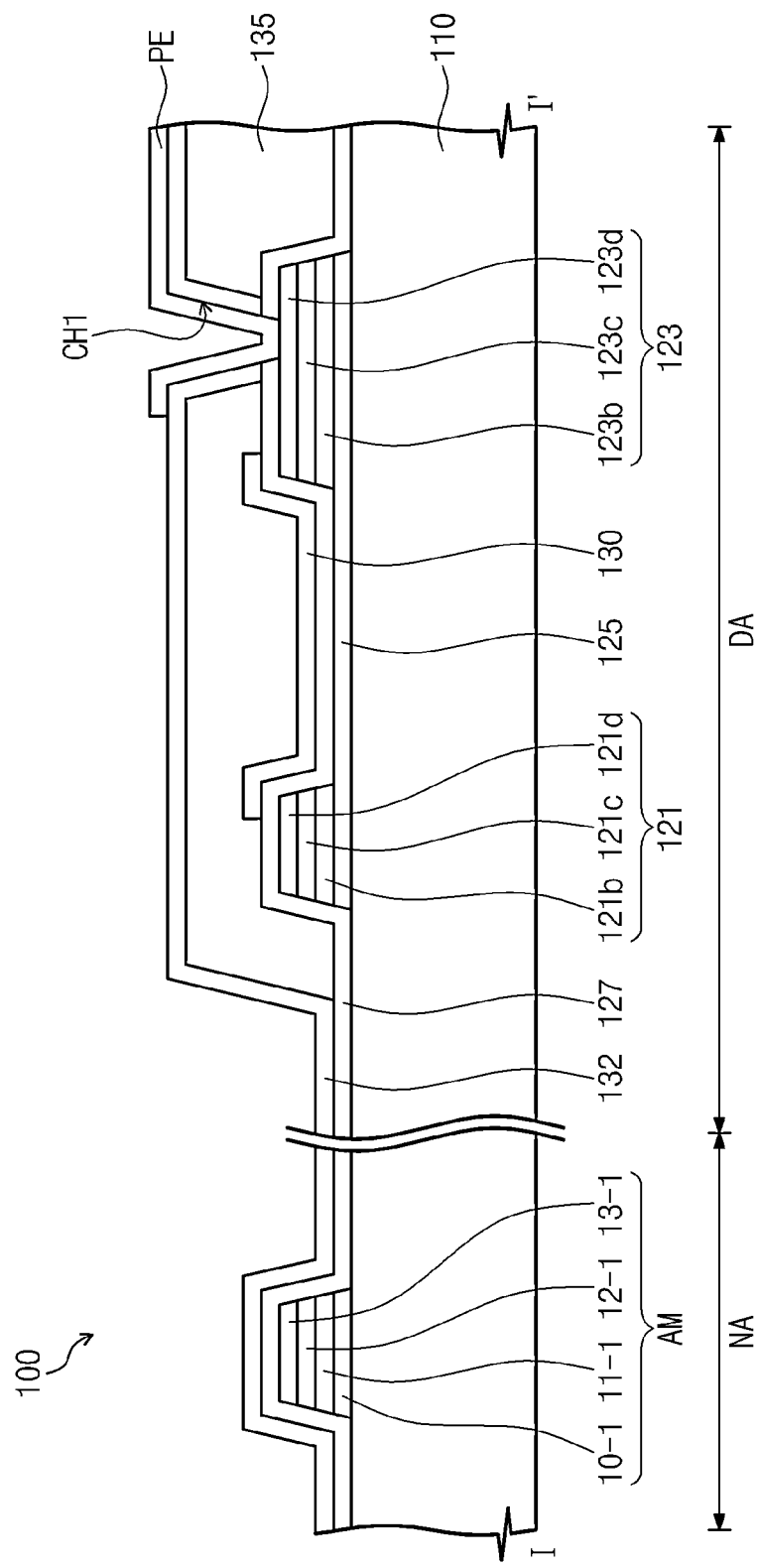

Referring to FIGS. 11A and 11B, the pixel electrode PE may be disposed on the second insulating layer 132. The pixel electrode PE may be electrically connected to the drain electrode 123 exposed by the first contact hole CH1. In an exemplary embodiment, the pixel electrode PE may be a transparent electrode (e.g., of ITO or IZO).

As the afore-described process, the TFT substrate 100 may have the structure of FIGS. 2 and 3.

Figures 12A, 12B:
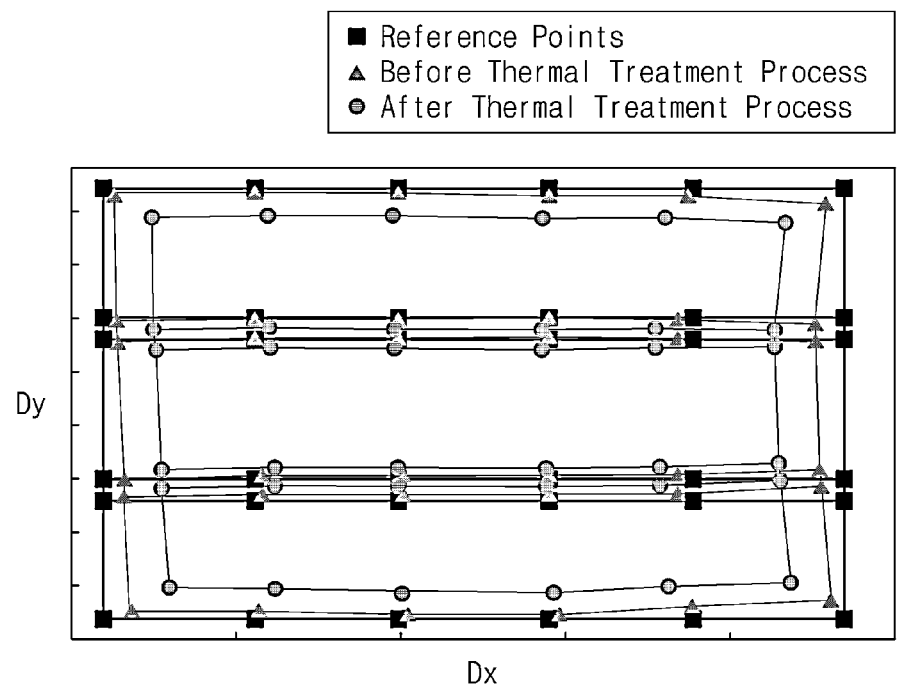

A shrinkage behavior of a TFT substrate according to a comparative example was measured at thirty-six different points before and after a thermal treatment process. FIG. 12A is a table showing a statistical property of the measured shrinkage behavior, FIG. 12B is a diagram showing the measured shrinkage behaviors at the thirty-six different points, and FIG. 12C is a diagram showing displacements of the thirty-six different points, which were caused by the thermal shrinkage and were respectively measured from thirty-six reference points.

The TFT substrate used in the measurement has a rectangular shape, whose longitudinal and traverse axes were parallel to Dx and Dy axes, respectively.

The thirty-six reference points, which were selected in the measurement of the thermal shrinkage behaviors, are represented by black marks in FIG. 12B and by an intersectional point between the Dx and Dy axes in FIG. 12C.

As shown in FIGS. 12A through 12C, the shrinkage of the TFT substrate after the thermal treatment process was significantly increased, compared with before the thermal treatment process.

According to exemplary embodiments of the invention, in a method of fabricating a TFT substrate, the alignment mark AM is provided after performing the thermal treatment process to the oxide semiconductor pattern 125. Accordingly, even when the insulating substrate 110 is shrunken by the thermal treatment process, it is possible to prevent the alignment mark AM from being influenced by the shrinkage of the insulating substrate 110. In other words, since the alignment mark AM is provided at the same operation as the source and drain electrodes and is not affected by the thermal treatment process and the consequent shrinkage of the insulating substrate 110, it is possible to prevent misalignment from occurring in the subsequent processes of providing gate patterns (e.g., gate lines and gate electrodes), of providing a pixel electrode, and of bonding the TFT substrate and the counter substrate.

According to exemplary embodiments of the invention, in a process of fabricating a TFT substrate, an alignment mark may be provided after a thermal treatment process, and thus, it is possible to prevent the alignment mark from being shrunken and consequently prevent misalignment from occurring in subsequent processes.

According to exemplary embodiments of the invention, the TFT substrate and the display device can be fabricated without technical problems associated with the misalignment.

While exemplary embodiments of the invention have been particularly shown and described, it will be understood by one of ordinary skill in the art that variations in form and detail may be made therein without departing from the spirit and scope of the attached claims.

What is claimed is:

1. A method of fabricating a thin-film transistor substrate, the method comprising:
    disposing an oxide semiconductor layer on an insulating substrate;
    performing a thermal treatment process to the oxide semiconductor layer;
    providing an alignment mark, a source electrode, a drain electrode, and an oxide semiconductor pattern, after the thermal treatment process;
    providing a gate electrode, after the thermal treatment process; and
    providing a pixel electrode connected to the drain electrode,
    wherein the providing the alignment mark, the source electrode, the drain electrode and the oxide semiconductor pattern comprises:
        providing at least two deposition layers on the oxide semiconductor layer; and
        patterning the at least two deposition layers using a halftone mask, and
    wherein the patterning the at least two deposition layers comprises:
        providing a photosensitive film on the deposition layers;
        exposing and developing the photosensitive film and providing first and second photosensitive film portions;
        etching the at least two deposition layers using the first and second photosensitive film portions as an etch mask and providing the alignment mark and a data pattern;
        removing the first and second photosensitive film portions and providing a third photosensitive film portion; and
        partially removing the data pattern using the third photosensitive film portion as an etch mask,
    wherein the exposing the photosensitive film is performed using the halftone mask and thereby the first and second photosensitive film portions have different thicknesses from each other.

2. The method of claim 1, wherein
    the providing the alignment mark and the data pattern is performed using a first etching solution, and
    the partially removing the data pattern is performed using a second etching solution different from the first etching solution.

3. The method of claim 1, wherein the providing the at least two deposition layers comprises:
    disposing a first material layer on the oxide semiconductor layer;
    disposing a second material layer on the first material layer; and
    disposing a third material layer on the second material layer.

4. The method of claim 3, wherein each of the first and third material layers comprises at least one of vanadium (V), zirconium (Zr), tantalum (Ta), manganese (Mn), magnesium (Mg), chromium (Cr), molybdenum (Mo), cobalt (Co), niobium (Nb), nickel (Ni), copper alloys, indium-zinc oxide, gallium-zinc oxide, and aluminum-zinc oxide.

5. The method of claim 3, wherein the second material layer comprises copper (Cu) or copper alloys.

6. The method of claim 1, wherein the thermal treatment process is performed at a temperature of about 350 degrees Celsius or higher.

7. The method of claim 1, wherein
    the insulating substrate comprises a display region, and a non-display region adjacent to the display region, and
    the alignment mark is overlapped with the non-display region.

8. The method of claim 1, wherein the oxide semiconductor layer comprises at least one of zinc (Zn), indium (In), tin (Sn), or gallium (Ga).

9. A thin-film transistor substrate, comprising:
    an insulating substrate including a display region, and a non-display region adjacent to the display region;
    an oxide semiconductor pattern disposed on the insulating substrate and overlapped with the display region;
    an alignment mark which is disposed on the insulating substrate, overlapped with the non-display region, and comprises:
    a first layer disposed at the same vertical height as that of the oxide semiconductor pattern in a cross section; and
    a mark layer disposed on the first layer;
    a source electrode disposed on the oxide semiconductor pattern and at the same vertical height as that of the mark layer in the cross section;
    a drain electrode disposed on the oxide semiconductor pattern and spaced apart from the source electrode and at the same vertical height as that of the mark layer in the cross section;
    a gate electrode disposed on the oxide semiconductor pattern and electrically separated from the source and drain electrodes; and
    a pixel electrode connected to the drain electrode.

10. The thin-film transistor substrate of claim 9, wherein the oxide semiconductor pattern comprises at least one of zinc (Zn), indium (In), tin (Sn), and gallium (Ga).

11. The thin-film transistor substrate of claim 9, wherein each of the source and drain electrodes comprises:
- a barrier layer disposed on the oxide semiconductor pattern;
- a main wiring layer disposed on the barrier layer; and
- a capping layer disposed on the main wiring layer.

12. The thin-film transistor substrate of claim 11, wherein the mark layer comprises:
- a second layer which is disposed on the first layer and includes the same material as that of the barrier layer;
- a third layer which is disposed on the second layer and includes the same material as that of the main wiring layer; and
- a fourth layer which is disposed on the third layer and includes the same material as that of the capping layer.

13. The thin-film transistor substrate of claim 11, wherein each of the barrier and capping layers comprises at least one of vanadium (V), zirconium (Zr), tantalum (Ta), manganese (Mn), magnesium (Mg), chromium (Cr), molybdenum (Mo), cobalt (Co), niobium (Nb), nickel (Ni), copper alloys, indium-zinc oxide, gallium-zinc oxide, and aluminum-zinc oxide.

14. The thin-film transistor substrate of claim 11, wherein the main wiring layer comprises copper or copper alloys.

15. A display device, comprising:
a thin-film transistor substrate which comprises:
an insulating substrate including a display region, and a non-display region adjacent to the display region;
an oxide semiconductor pattern disposed on the insulating substrate and overlapped with the display region;
an alignment mark which is disposed on the insulating substrate, overlapped with the non-display region and comprises:
- a first layer disposed at the disposed at the same vertical height as that of the oxide semiconductor pattern in a cross section; and
- a mark layer on the first layer;
- a source electrode disposed on the oxide semiconductor pattern and at the same vertical height as that of the mark layer in the cross section;
- a drain electrode disposed on the oxide semiconductor pattern and at the same vertical height as that of the mark layer in the cross section and spaced apart from the source electrode;
- a gate electrode disposed on the oxide semiconductor pattern and electrically separated from the source and drain electrodes; and
- a pixel electrode connected to the drain electrode,
a counter substrate disposed to face the thin-film transistor substrate; and
a liquid crystal layer between the thin-film transistor substrate and the counter substrate.

* * * * *